US009447498B2

(12) United States Patent
Shiba

(10) Patent No.: US 9,447,498 B2
(45) Date of Patent: Sep. 20, 2016

(54) METHOD FOR PERFORMING UNIFORM PROCESSING IN GAS SYSTEM-SHARING MULTIPLE REACTION CHAMBERS

(71) Applicant: ASM IP Holding B.V., Almere (NL)

(72) Inventor: Eiichiro Shiba, Tama (JP)

(73) Assignee: ASM IP Holding B.V., Almere (NL)

( * ) Notice: Subject to any disclaimer, the term of this patent is extended or adjusted under 35 U.S.C. 154(b) by 123 days.

(21) Appl. No.: 14/218,374

(22) Filed: Mar. 18, 2014

(65) Prior Publication Data

US 2015/0267297 A1  Sep. 24, 2015

(51) Int. Cl.
| | | |
|---|---|---|
| *C23C 16/00* | (2006.01) | |
| *C23C 16/455* | (2006.01) | |
| *C23C 16/40* | (2006.01) | |
| *C23C 16/448* | (2006.01) | |
| *C23C 16/505* | (2006.01) | |

(52) U.S. Cl.
CPC ....... *C23C 16/45561* (2013.01); *C23C 16/401* (2013.01); *C23C 16/448* (2013.01); *C23C 16/45536* (2013.01); *C23C 16/505* (2013.01)

(58) Field of Classification Search
CPC .. C23C 16/00; C23C 16/4408; C23C 16/452
See application file for complete search history.

(56) References Cited

U.S. PATENT DOCUMENTS

| | | |
|---|---|---|
| D56,051 S | 8/1920 | Cohn |
| 2,161,626 A | 6/1939 | Loughner et al. |
| 2,745,640 A | 5/1956 | Cushman |
| 2,990,045 A | 9/1959 | Root |
| 3,089,507 A | 5/1963 | Drake et al. |
| 3,094,396 A | 6/1963 | Sylvester et al. |
| 3,232,437 A | 2/1966 | Hultgren |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,134,425 A | 1/1979 | Gussefeld et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,570,328 A | 2/1986 | Price et al. |
| 4,579,623 A | 4/1986 | Suzuki et al. |
| D288,556 S | 3/1987 | Wallgren |
| 4,653,541 A | 3/1987 | Oehlschlaeger et al. |
| 4,654,226 A | 3/1987 | Jackson et al. |
| 4,681,134 A | 7/1987 | Paris |
| 4,718,637 A | 1/1988 | Contin |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,837,185 A | 6/1989 | Yau et al. |
| 4,854,263 A | 8/1989 | Chang et al. |
| 4,857,137 A | 8/1989 | Tashiro et al. |
| 4,857,382 A | 8/1989 | Sheng et al. |
| 4,882,199 A | 11/1989 | Sadoway et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,991,614 A | 2/1991 | Hammel |
| 5,013,691 A | 5/1991 | Lory et al. |

(Continued)

FOREIGN PATENT DOCUMENTS

| | | |
|---|---|---|
| CN | I563483 | 1/2005 |
| CN | 101330015 | 12/2008 |

(Continued)

OTHER PUBLICATIONS

Easley, Christopher, et al., "Thermal isolation of microchip reaction chambers for rapid non-contact DNA amplification". J. Micromech. Microeng. 17 (2007) 1758-1766.*
Bearzotti, et al., "Fast Humidity Response of a Metal Halide-Doped Novel Polymer," Sensors and Actuators B, 7, pp. 451-454. (1992).
Bhatnagar et al., "Copper Interconnect Advance to Meet Moore's Law Milestones," Solid State Technology, 52, 10 (2009).
Buriak, "Oragnometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, 30, 2, IEEE Electron Device Society 133-135 (2009).
Chen et al., "A Self-Aligned Airgap Interconnect Scheme," IEEE International Interconnect Technology Conference, 1-3, 146-148 (2009).

(Continued)

*Primary Examiner* — Bret Chen
(74) *Attorney, Agent, or Firm* — Snell & Wilmer LLP

(57) ABSTRACT

A method for performing uniform processing in multiple reaction chambers includes (a) conducting a cycle constituted by steps in each reaction chamber according to the order of the reaction chambers at which the steps are conducted; and then (b) conducting the steps in each reaction chamber after changing the immediately prior order of the reaction chambers at which the steps are conducted; and then (c) repeating process (b) until a target treatment is complete at the multiple reaction chambers. The target treatment conducted on a substrate in each reaction chamber is the same.

15 Claims, 13 Drawing Sheets

(56) References Cited

U.S. PATENT DOCUMENTS

| | | |
|---|---|---|
| 5,027,746 A | 7/1991 | Frijlink |
| 5,028,366 A | 7/1991 | Harakal et al. |
| 5,060,322 A | 10/1991 | Delepine |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,116,018 A | 5/1992 | Friemoth et al. |
| D327,534 S | 6/1992 | Manville |
| 5,119,760 A | 6/1992 | McMillan et al. |
| 5,167,716 A | 12/1992 | Boitnott et al. |
| 5,178,682 A | 1/1993 | Tsukamoto et al. |
| 5,183,511 A | 2/1993 | Yamazaki et al. |
| 5,192,717 A * | 3/1993 | Kawakami ........ H01L 21/02422 148/DIG. 122 |
| 5,194,401 A | 3/1993 | Adams et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,246,500 A | 9/1993 | Samata et al. |
| 5,271,967 A | 12/1993 | Kramer et al. |
| 5,288,684 A | 2/1994 | Yamazaki et al. |
| 5,306,946 A | 4/1994 | Yamamoto |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,360,269 A | 11/1994 | Ogawa et al. |
| 5,380,367 A | 1/1995 | Bertone |
| 5,382,311 A | 1/1995 | Ishikawa et al. |
| 5,404,082 A | 4/1995 | Hernandez et al. |
| 5,413,813 A | 5/1995 | Cruse et al. |
| 5,415,753 A | 5/1995 | Hurwitt et al. |
| 5,421,893 A | 6/1995 | Perlov |
| 5,422,139 A | 6/1995 | Fischer |
| 5,430,011 A | 7/1995 | Tanaka et al. |
| 5,494,494 A | 2/1996 | Mizuno et al. |
| 5,496,408 A | 3/1996 | Motoda et al. |
| 5,504,042 A | 4/1996 | Cho et al. |
| 5,518,549 A | 5/1996 | Hellwig |
| 5,527,417 A | 6/1996 | Iida et al. |
| 5,531,835 A | 7/1996 | Fodor et al. |
| 5,574,247 A | 11/1996 | Nishitani et al. |
| 5,577,331 A | 11/1996 | Suzuki |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,718,574 A | 2/1998 | Shimazu |
| 5,724,748 A | 3/1998 | Brooks |
| 5,728,223 A | 3/1998 | Murakami et al. |
| 5,730,801 A | 3/1998 | Tepman et al. |
| 5,732,744 A | 3/1998 | Barr et al. |
| 5,736,314 A | 4/1998 | Hayes et al. |
| 5,777,838 A | 7/1998 | Tamagawa et al. |
| 5,781,693 A | 7/1998 | Balance et al. |
| 5,796,074 A | 8/1998 | Edelstein et al. |
| 5,801,104 A | 9/1998 | Schuegraf et al. |
| 5,819,434 A | 10/1998 | Herchen et al. |
| 5,827,757 A | 10/1998 | Robinson, Jr. et al. |
| 5,836,483 A | 11/1998 | Disel |
| 5,837,320 A | 11/1998 | Hampden-Smith et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,873,942 A * | 2/1999 | Park ..................... C23C 16/52 118/715 |
| 5,877,095 A | 3/1999 | Tamura et al. |
| D409,894 S | 5/1999 | McClurg |
| 5,908,672 A | 6/1999 | Ryu |
| 5,916,365 A | 6/1999 | Sherman |
| 5,920,798 A | 7/1999 | Higuchi et al. |
| 5,968,275 A | 10/1999 | Lee et al. |
| 5,975,492 A | 11/1999 | Brenes |
| 5,979,506 A | 11/1999 | Aarseth |
| 5,997,588 A * | 12/1999 | Goodwin ................ F16K 51/02 29/25.01 |
| 5,997,768 A | 12/1999 | Scully |
| D419,652 S | 1/2000 | Hall et al. |
| 6,013,553 A | 1/2000 | Wallace |
| 6,015,465 A | 1/2000 | Kholodenko et al. |
| 6,017,779 A | 1/2000 | Miyasaka |
| 6,024,799 A | 2/2000 | Chen |
| 6,035,101 A | 3/2000 | Sajoto et al. |
| 6,042,652 A * | 3/2000 | Hyun ..................... C23C 16/44 118/715 |
| 6,044,860 A | 4/2000 | Neu |
| 6,050,506 A | 4/2000 | Guo et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,099,302 A | 8/2000 | Hong et al. |
| 6,122,036 A | 9/2000 | Yamasaki et al. |
| 6,124,600 A | 9/2000 | Moroishi et al. |
| 6,125,789 A | 10/2000 | Gupta et al. |
| 6,129,044 A | 10/2000 | Zhao et al. |
| 6,134,807 A | 10/2000 | Komino |
| 6,137,240 A | 10/2000 | Bogdan et al. |
| 6,140,252 A | 10/2000 | Cho et al. |
| 6,148,761 A | 11/2000 | Majewski et al. |
| 6,160,244 A | 12/2000 | Ohashi |
| 6,161,500 A | 12/2000 | Kopacz et al. |
| 6,162,323 A | 12/2000 | Koshimizu et al. |
| 6,180,979 B1 | 1/2001 | Hofmann et al. |
| 6,187,691 B1 | 2/2001 | Fukuda |
| 6,190,634 B1 | 2/2001 | Lieber et al. |
| 6,194,037 B1 | 2/2001 | Terasaki et al. |
| 6,201,999 B1 | 3/2001 | Jevtic |
| 6,207,932 B1 | 3/2001 | Yoo |
| 6,212,789 B1 | 4/2001 | Kato |
| 6,218,288 B1 | 4/2001 | Li et al. |
| 6,250,250 B1 | 6/2001 | Maishev et al. |
| 6,271,148 B1 | 8/2001 | Kao |
| 6,274,878 B1 | 8/2001 | Li et al. |
| 6,281,098 B1 * | 8/2001 | Wang ..................... C01B 33/039 117/88 |
| 6,287,965 B1 | 9/2001 | Kang et al. |
| D449,873 S | 10/2001 | Bronson |
| 6,296,909 B1 | 10/2001 | Spitsberg |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,312,525 B1 | 11/2001 | Bright et al. |
| 6,315,512 B1 | 11/2001 | Tabrizi et al. |
| D451,893 S | 12/2001 | Robson |
| D452,220 S | 12/2001 | Robson |
| 6,325,858 B1 | 12/2001 | Wengert |
| 6,326,597 B1 | 12/2001 | Lubomirsky et al. |
| 6,329,297 B1 | 12/2001 | Balish |
| 6,342,427 B1 | 1/2002 | Choi et al. |
| 6,347,636 B1 | 2/2002 | Xia |
| 6,352,945 B1 | 3/2002 | Matsuki |
| 6,367,410 B1 | 4/2002 | Leahey et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran |
| 6,375,312 B1 | 4/2002 | Ikeda et al. |
| D457,609 S | 5/2002 | Piano |

(56) References Cited

U.S. PATENT DOCUMENTS

| | | |
|---|---|---|
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,435,798 B1 | 8/2002 | Satoh |
| 6,436,819 B1 | 8/2002 | Zhang |
| 6,437,444 B2 | 8/2002 | Andideh |
| 6,445,574 B1 | 9/2002 | Saw et al. |
| 6,446,573 B2 | 9/2002 | Hirayama et al. |
| 6,450,757 B1 | 9/2002 | Saeki |
| 6,454,860 B2 | 9/2002 | Metzner et al. |
| 6,455,445 B2 | 9/2002 | Matsuki |
| 6,461,435 B1 | 10/2002 | Littau et al. |
| 6,468,924 B2 | 10/2002 | Lee |
| 6,472,266 B1 | 10/2002 | Yu et al. |
| 6,475,276 B1 | 11/2002 | Elers et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Backlund |
| 6,483,989 B1 | 11/2002 | Okada et al. |
| 6,494,065 B2 | 12/2002 | Babbitt |
| 6,499,533 B2 | 12/2002 | Yamada |
| 6,503,562 B1 | 1/2003 | Saito et al. |
| 6,503,826 B1 | 1/2003 | Oda |
| 6,511,539 B1 | 1/2003 | Raaijmakers |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,395 B2 | 3/2003 | Werkhoven et al. |
| 6,558,755 B2 | 5/2003 | Berry et al. |
| 6,569,239 B2 | 5/2003 | Arai et al. |
| 6,573,030 B1 | 6/2003 | Fairbairn et al. |
| 6,576,062 B2 | 6/2003 | Matsuse |
| 6,576,064 B2 | 6/2003 | Griffiths et al. |
| 6,576,300 B1 | 6/2003 | Berry et al. |
| 6,579,833 B1 | 6/2003 | McNallan et al. |
| 6,583,048 B1 | 6/2003 | Vincent et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 * | 10/2003 | Deng .............. C23C 16/50 427/588 |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki |
| 6,709,989 B2 | 3/2004 | Ramdani et al. |
| 6,710,364 B2 | 3/2004 | Guldi et al. |
| 6,713,824 B1 | 3/2004 | Mikata |
| 6,716,571 B2 | 4/2004 | Gabriel |
| 6,723,642 B1 | 4/2004 | Lim et al. |
| 6,730,614 B1 | 5/2004 | Lim et al. |
| 6,734,090 B2 | 5/2004 | Agarwala et al. |
| 6,740,853 B1 | 5/2004 | Kitayama et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,318 B2 | 6/2004 | Nguyen et al. |
| 6,759,098 B2 | 7/2004 | Han |
| 6,760,981 B2 | 7/2004 | Leap |
| 6,784,108 B1 | 8/2004 | Donohoe et al. |
| D497,977 S | 11/2004 | Engelbrektsson |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,247 B1 | 4/2005 | Hsu |
| 6,874,480 B1 | 4/2005 | Ismailov |
| 6,875,677 B1 | 4/2005 | Conley, Jr. et al. |
| 6,876,017 B2 | 4/2005 | Goodner |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Aylward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,796 B2 | 7/2005 | Albano et al. |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Alm et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |

(56) References Cited

U.S. PATENT DOCUMENTS

| | | |
|---|---|---|
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Alm et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,582 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,381,644 B1 | 6/2008 | Subramonium et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,411,352 B2 | 8/2008 | Madocks |
| 7,414,281 B1 | 8/2008 | Fastow |
| 7,416,989 B1 | 8/2008 | Liu et al. |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki et al. |
| 7,494,882 B2 | 2/2009 | Vitale |
| 7,498,242 B2 | 3/2009 | Kumar et al. |
| 7,501,292 B2 | 3/2009 | Matsushita et al. |
| 7,503,980 B2 | 3/2009 | Kida et al. |
| D590,933 S | 4/2009 | Vansell |
| 7,514,375 B1 | 4/2009 | Shanker et al. |
| D593,969 S | 6/2009 | Li |
| 7,541,297 B2 | 6/2009 | Mallick et al. |
| 7,547,363 B2 | 6/2009 | Tomiyasu et al. |
| 7,550,396 B2 | 6/2009 | Frohberg et al. |
| 7,566,891 B2 | 7/2009 | Rocha-Alvarez et al. |
| 7,575,968 B2 | 8/2009 | Sadaka et al. |
| 7,579,785 B2 | 8/2009 | DeVincentis et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,598,513 B2 | 10/2009 | Kouvetakis et al. |
| 7,601,223 B2 | 10/2009 | Lindfors et al. |
| 7,601,225 B2 | 10/2009 | Tuominen et al. |
| 7,611,751 B2 | 11/2009 | Elers |
| 7,611,980 B2 | 11/2009 | Wells et al. |
| 7,618,226 B2 | 11/2009 | Takizawa |
| D606,952 S | 12/2009 | Lee |
| 7,629,277 B2 | 12/2009 | Ghatnagar |
| 7,632,549 B2 | 12/2009 | Goundar |
| 7,640,142 B2 | 12/2009 | Tachikawa et al. |
| 7,651,583 B2 | 1/2010 | Kent et al. |
| 7,651,961 B2 | 1/2010 | Clark |
| D609,652 S | 2/2010 | Nagasaka |
| D609,655 S | 2/2010 | Sugimoto |
| 7,678,197 B2 | 3/2010 | Maki |
| 7,678,715 B2 | 3/2010 | Mungekar et al. |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| D614,593 S | 4/2010 | Lee |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,745,346 B2 | 6/2010 | Hausmann et al. |
| 7,748,760 B2 | 7/2010 | Kushida |
| 7,754,621 B2 | 7/2010 | Putjkonen |
| 7,763,869 B2 | 7/2010 | Matsushita et al. |
| 7,767,262 B2 | 8/2010 | Clark |
| 7,771,796 B2 | 8/2010 | Kohno et al. |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reid et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |
| 7,888,233 B1 | 2/2011 | Gauri |
| D634,719 S | 3/2011 | Yasuda et al. |
| 7,897,215 B1 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,939,447 B2 | 5/2011 | Bauer et al. |
| 7,955,516 B2 | 6/2011 | Chandrachood et al. |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,992,318 B2 | 8/2011 | Kawaji |
| 7,994,721 B2 | 8/2011 | Espiau et al. |
| 7,998,875 B2 | 8/2011 | DeYoung |
| 8,003,174 B2 | 8/2011 | Fukazawa |
| 8,004,198 B2 | 8/2011 | Bakre et al. |
| 8,020,315 B2 | 9/2011 | Nishimura |
| 8,030,129 B2 | 10/2011 | Jeong |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,043,972 B1 | 10/2011 | Liu et al. |
| 8,055,378 B2 | 11/2011 | Numakura |
| 8,060,252 B2 | 11/2011 | Gage et al. |
| 8,071,451 B2 | 12/2011 | Uzoh |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Grether |
| 8,092,604 B2 | 1/2012 | Tomiyasu et al. |
| D653,734 S | 2/2012 | Sisk |
| D654,884 S | 2/2012 | Honma |

(56) References Cited

U.S. PATENT DOCUMENTS

| | | |
|---|---|---|
| D655,055 S | 2/2012 | Toll |
| 8,119,466 B2 | 2/2012 | Avouris |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |
| 8,252,659 B2 | 8/2012 | Huyghebaert et al. |
| 8,252,691 B2 | 8/2012 | Beynet et al. |
| 8,272,516 B2 | 9/2012 | Salvador |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| D676,943 S | 2/2013 | Kluss |
| 8,367,528 B2 | 2/2013 | Bauer et al. |
| 8,372,204 B2 | 2/2013 | Nakamura |
| 8,393,091 B2 | 3/2013 | Kawamoto |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 12/2013 | Goto et al. |
| 8,617,411 B2 | 12/2013 | Singh |
| 8,633,115 B2 | 1/2014 | Chang et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,749 B2 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,933,375 B2 | 1/2015 | Dunn et al. |
| 8,940,646 B1 * | 1/2015 | Chandrasekharan H01L 21/0228 118/715 |
| D723,153 S | 2/2015 | Borkholder |
| 8,946,830 B2 | 2/2015 | Jung et al. |
| 8,956,983 B2 | 2/2015 | Swaminathan |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,365 S | 4/2015 | Weigensberg |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B2 | 5/2015 | Nakano |
| D732,145 S | 6/2015 | Yamagishi |
| D732,644 S | 6/2015 | Yamagishi et al. |
| D733,261 S | 6/2015 | Yamagishi et al. |
| D733,843 S | 7/2015 | Yamagishi et al. |
| D734,377 S | 7/2015 | Hirakida |
| D735,836 S | 8/2015 | Yamagishi |
| 9,096,931 B2 | 8/2015 | Yednak et al. |
| 9,117,657 B2 | 8/2015 | Nakano et al. |
| 9,117,866 B2 | 8/2015 | Marquardt et al. |
| D739,222 S | 9/2015 | Chadbourne |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,169,975 B2 | 10/2015 | Sarin et al. |
| 9,171,714 B2 | 10/2015 | Mori |
| 9,171,716 B2 | 10/2015 | Fukuda |
| D743,513 S | 11/2015 | Yamagishi |
| 9,177,784 B2 | 11/2015 | Raisanen et al. |
| 9,190,263 B2 | 11/2015 | Ishikawa et al. |
| 9,196,483 B1 | 11/2015 | Lee et al. |
| 9,202,727 B2 | 12/2015 | Dunn et al. |
| 9,228,259 B2 | 1/2016 | Haukka et al. |
| 9,240,412 B2 | 1/2016 | Xie et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 * | 9/2001 | Hasegawa ......... C23C 16/4401 438/765 |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |

(56) References Cited

U.S. PATENT DOCUMENTS

| | | |
|---|---|---|
| 2002/0110991 A1 | 8/2002 | Li |
| 2002/0114886 A1 | 8/2002 | Chou et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0082307 A1 | 5/2003 | Chung et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0134038 A1 | 7/2003 | Paranjpe |
| 2003/0141820 A1 | 7/2003 | White et al. |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0192875 A1 | 10/2003 | Bieker et al. |
| 2003/0198587 A1 | 10/2003 | Kaloyeros |
| 2003/0209323 A1 | 11/2003 | Yokogaki |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0016637 A1 | 1/2004 | Yang |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124549 A1 | 7/2004 | Curran |
| 2004/0134429 A1 | 7/2004 | Yamanaka |
| 2004/0144980 A1 | 7/2004 | Ahn et al. |
| 2004/0146644 A1 | 7/2004 | Xiao et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0214445 A1 | 10/2004 | Shimizu et al. |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0003662 A1 | 1/2005 | Jursich et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0199013 A1 | 9/2005 | Vandroux et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |

(56) References Cited

U.S. PATENT DOCUMENTS

| | | |
|---|---|---|
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kuppurao et al. |
| 2007/0049053 A1 | 3/2007 | Mahajani |
| 2007/0054499 A1* | 3/2007 | Jang ................ C23C 16/18 438/778 |
| 2007/0059948 A1 | 3/2007 | Metzner et al. |
| 2007/0062453 A1 | 3/2007 | Ishikawa |
| 2007/0065578 A1* | 3/2007 | McDougall ......... C23C 16/4404 427/248.1 |
| 2007/0066010 A1 | 3/2007 | Ando |
| 2007/0066079 A1 | 3/2007 | Kloster et al. |
| 2007/0077355 A1 | 4/2007 | Chacin et al. |
| 2007/0082132 A1 | 4/2007 | Shinriki |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVincentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVincentis et al. |
| 2007/0264807 A1 | 11/2007 | Leone et al. |
| 2007/0275166 A1 | 11/2007 | Thridandam et al. |
| 2007/0277735 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Lukas |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0133154 A1 | 6/2008 | Krauss et al. |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0178805 A1 | 7/2008 | Paterson et al. |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0220619 A1 | 9/2008 | Matsushita et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0257494 A1 | 10/2008 | Hayashi et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |

(56) References Cited

U.S. PATENT DOCUMENTS

| | | |
|---|---|---|
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0104789 A1 | 4/2009 | Mallick et al. |
| 2009/0107404 A1 | 4/2009 | Ogliari et al. |
| 2009/0120580 A1 | 5/2009 | Kagoshima et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukuzawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1* | 12/2009 | Patton .................. B01J 7/02 422/148 |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0040441 A1 | 2/2010 | Obikane |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |
| 2010/0159638 A1 | 6/2010 | Jeong |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0027999 A1 | 2/2011 | Sparks et al. |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0139748 A1 | 6/2011 | Donnelly et al. |
| 2011/0143032 A1 | 6/2011 | Vrtis et al. |
| 2011/0143461 A1 | 6/2011 | Fish et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0192820 A1 | 8/2011 | Yeom et al. |
| 2011/0198736 A1 | 8/2011 | Shero et al. |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0239936 A1 | 10/2011 | Suzuki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |

(56) References Cited

U.S. PATENT DOCUMENTS

| | | |
|---|---|---|
| 2012/0024479 A1 | 2/2012 | Palagashvili et al. |
| 2012/0032311 A1 | 2/2012 | Gates |
| 2012/0043556 A1 | 2/2012 | Dube et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0122302 A1 | 5/2012 | Weisman et al. |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1* | 7/2012 | Won ............... C23C 16/345 427/575 |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0263876 A1 | 10/2012 | Haukka et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabari et al. |
| 2013/0019945 A1 | 1/2013 | Hekmatshoar-Tabari et al. |
| 2013/0023129 A1 | 1/2013 | Reed |
| 2013/0048606 A1 | 2/2013 | Mao et al. |
| 2013/0064973 A1 | 3/2013 | Chen et al. |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0084156 A1 | 4/2013 | Shimamoto |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0168354 A1 | 7/2013 | Kanarik |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0288480 A1 | 10/2013 | Sanchez et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0295779 A1 | 11/2013 | Chandra et al. |
| 2013/0310290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0033978 A1 | 2/2014 | Adachi et al. |
| 2014/0036274 A1 | 2/2014 | Marquardt et al. |
| 2014/0048765 A1 | 2/2014 | Ma et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0099798 A1 | 4/2014 | Tsuji |
| 2014/0103145 A1 | 4/2014 | White et al. |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0141625 A1 | 5/2014 | Fukazawa et al. |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0363985 A1 | 12/2014 | Jang et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0021599 A1 | 1/2015 | Ridgeway |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |

(56) References Cited

U.S. PATENT DOCUMENTS

| | | |
|---|---|---|
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |
| 2016/0013024 A1 | 1/2016 | Milligan et al. |
| 2016/0024656 A1 | 1/2016 | White et al. |
| 2016/0051964 A1 | 2/2016 | Tolle et al. |

FOREIGN PATENT DOCUMENTS

| | | |
|---|---|---|
| CN | 102008052750 | 6/2009 |
| CN | 101522943 | 9/2009 |
| CN | 101423937 | 9/2011 |
| EP | 2036600 | 3/2009 |
| EP | 2426233 | 7/2012 |
| JP | 03-044472 | 2/1991 |
| JP | H04115531 | 4/1992 |
| JP | 06-53210 | 2/1994 |
| JP | 07-130731 | 5/1995 |
| JP | 07-034936 | 8/1995 |
| JP | 7-272694 | 10/1995 |
| JP | H07283149 | 10/1995 |
| JP | 08-181135 | 7/1996 |
| JP | H08335558 | 12/1996 |
| JP | 10-064696 | 3/1998 |
| JP | 10-0261620 | 9/1998 |
| JP | 2845163 | 1/1999 |
| JP | 2001-15698 | 1/2001 |
| JP | 2001342570 | 12/2001 |
| JP | 2004014952 | 1/2004 |
| JP | 2009091848 | 3/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010067940 | 3/2010 |
| JP | 2010097834 | 4/2010 |
| JP | 2010025967 | 9/2010 |
| JP | 2010251444 | 10/2010 |
| JP | 2012089837 | 5/2012 |
| JP | 2012146939 | 8/2012 |
| KR | 20100020834 | 2/2010 |
| TW | I226380 | 1/2005 |
| TW | 200701301 | 1/2007 |
| WO | 9832893 | 7/1998 |
| WO | 2004008827 | 1/2004 |
| WO | 2004010467 | 1/2004 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2007140376 | 12/2007 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |

OTHER PUBLICATIONS

Choi et al., "Improvement of Silicon Direct Bonding using Surfaces Activated by Hydrogen Plasma Treatment," Journal of the Korean Physical Society, 37, 6, 878-881 (2000).

Choi et al., "Low Temperature Formation of Silicon Oxide Thin Films by Atomic Layer Deposition Using NH3/O2 Plasma," ECS Solid State Letters, 2(12) 114-116 (2013).

Crowell, "Chemical methods of thin film deposition: Chemical vapor deposition, atomic layer deposition, and related technologies," Journal of Vacuum Science & Technology A 21.5, S88-S95 (2003).

Cui et al., "Impact of Reductive N2/H2 Plasma on Porous Low-Dielectric Constant SiCOH Thin Films," Journal of Applied Physics 97, I13302, 1-8 (2005).

Dingemans et al., "Comparison Between Aluminum Oxide Surface Passivation Films Deposited with Thermal Aid," Plasma Aid and Pecvd, 35th IEEE PVCS, Jun. 2010.

Drummond et al., "Hydrophobic Radiofrequency Plama-Deposited Polymer Films: Dielectric Properties and Surface Forces," Colloids and Surfaces A, 129-130, 117-129 (2006).

Easley et al., "Thermal Isolation of Microchip Reaction Chambers for Rapid Non-Contact DNA Amplification," J. Micromech Microeng. 17, 1758-1766 (2007).

Ge et al., "Carbon Nanotube-Based Synthetic Gecko Tapes," Department of Polymer Science, PNAS, 10792-10795 (2007).

George et al., "Atomic Layer Deposition: An Overview," Chem. Rev. 110, 111-131 (2010).

Grill et al., "The Effect of Plasma Chemistry on the Damage Induced Porous SiCOH Dielectrics," IBM Research Division, RC23683 (W0508-008), Material Science, 1-19 (2005).

Gupta et al., "Conversion of Metal Carbide to Carbide Derived Carbon by Reactive Ion Etching in Halogen Gas," Proceedings of SPIE—The International Society for Optical Engineering and Nanotechnologies for Space Application. ISSN: 0277-786X (2006).

Heo et al., "Structural Characterization of Nanoporous Low-Dielectric Constant SiCOH Films Using Organosilane Precursors," NSTI-Nanotech, vol. 4, 122-123 (2007).

H.J. Yun et al., "Comparison of Atomic Scale Etching of Poly-Si in Inductively Coupled Ar and He Plasmas," Korean Journal of Chemical Engineering, 24, 670-673 (2007).

June et al., "Double Patterning of Contact Array with Carbon Polymer," Proc. Of SPIE, 6924, 69240C, 1-10 (2008).

Katamreddy et al., "ALD and Characterization of Aluminum Oxide Deposited on Si(100) using Tris(diethylamino) Aluminum and Water Vapor," Journal of The Electrochemical Society, 153 (10) C701-706 (2006).

Kim et al., "Passivation Effect on Low-k S/OC Dielectrics by H2 Plasma Treatment," Journal of the Korean Physical Society. "40. 1, 94-98 (2002).

Kim et al., "Characateristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).

King, Plasma Enhanced Atomic Layer Deposition of SiNx: H and SiO2, J. Vac. Sci. Technol., A29(4) (2011).

Kobayshi et al., "Temperature Dependence of SiO2 Film Growth with Plasma-Enhanced Atomic Layer Deposition," International Journal on the Science and Technology of Condensed Matter, 520, 3994-3998 (2012).

Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

Koutoskeras et al. Texture and Microstructure Evolutions in Single-Phase TixTal-xN Alloys of Rocksalt Structure. Journal of Applied Physics, 110, 043535-1-043535-6, (2011).

Krenek et al. "IR Laser CVD of Nanodisperse Ge—Si—Sn Alloys Obtained by Dielectric Breakdown of GeH4/SiH4/SnH4 Mixtures", NanoCon, Bmo, Czech Republic, EU (2014).

Kurosawa et al., "Sythesis and Characterization of Plasma-Polymerized Hexamethyldisiloxane Films," Thin Solid Films, 506-507, 176-179 (2006).

Lieberman, et al., "Principles of Plasma Discharges and Materials Processing," Second Edition, 368-381.

(56) References Cited

OTHER PUBLICATIONS

Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector of Wafer Transfer Robot," Industial Robot: An International Journal, 79-91 (2012).
Mackus et al., "Optical Emission Spectroscopy as a Tool Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Maeng et al., "Electical properties of atomic layer disposition Hf02 and Hf0xNy on Si Substrates with Various Crystal Orientations," Journal of the Electrochemical Society, 155, Department of Materials Science of Engineering, Pohang University of Science and Technology, H267-H271 (2008).
Marsik et al., "Effect of Ultraviolet Curing Wavelength on Low-k Dielectric Material Properties and Plasma Damage Resistance," Sciencedirect.com 519, 11, 3619-3626 (2011).
Moeen, "Design, Modelling and Characterization of Si/SiGe Structure for IR Bolometer Applications," KTH Royal Institute of Techonology, Information and Communication Technology, Department of Intergrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mukai et al., "A Study of CD Budget in Spacer Patterning Technology," Proc. Of SPIE, 6924, 1-8 (2008).
Nogueira et al., "Production of Highly Hydrophobic Films Using Low Frequency and High Denisty Plasma," Revista Brasileira de Aplicacoes de Vacuo, 25(1), 45-53 (2006).
Novaro et al., "Theoretical Study on a Reaction Pathway of Ziegler-Natta-Type Catalysis," J. Chem. Phys. 68(5), 2337-2351 (1978).
Radamson et al., "Growth of Sn—alloued Group IV Materials for Photonic and Electronic Applications", Manufacturing Nano Structures, 5, 129-144.
Schmatz et al., "Unusual Isomerization Reactions in 1.3-Diaza-2-Silcyclopentanes," Oragnometallics, 23, 1180-1182 (2004).
Scientific and Technical Information Center EIC 2800 Search Report dated Feb. 16, 2012.
S.D. Athavale et al., "Realization of Atomic Layer Etching of Silicon", Journal of Vacuum Science and Technology B, 14, 3702-3705 (1996).
Shamma et al., "PDL Oxide Enabled Doubling," Proc. Of SPIE, 6924, 69240D, 1-10 (2008).
Varma, et al., "Effect of Metal Halides on Thermal, Mechanical, and Electrical Properites of Polypyromelitimide Films," Journal of Applied Polymer Science, 32, 3987-4000, (1986).
Wirths, et al., "SiGeSn Growth tudies Using Reduced Pressure Chemical Vapor Deposition Towards Optoeleconic Applications," This Soid Films, 557, 183-187 (2014).
Yun et al., "Behavior of Various Organosilicon Molecules in PECVD Processes for Hydrocarbon-Doped Silicon Oxide Films," Solid State Phenomena, 124-126, 347-350 (2007).

* cited by examiner

Fig. 9 (Background Art)

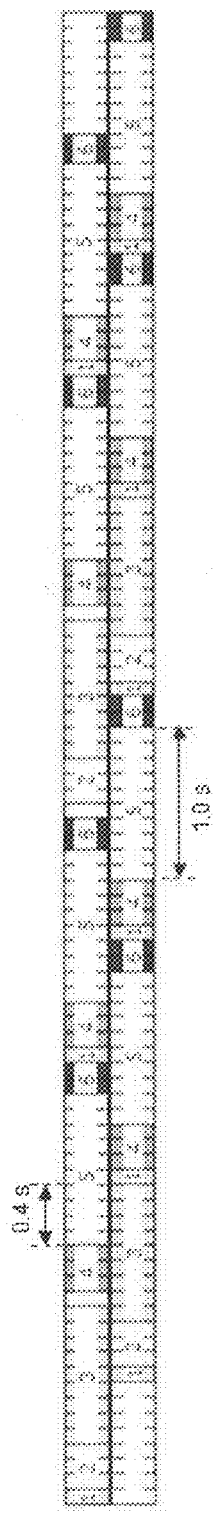

None: Purge without switching valves; 1: Purge with switching valves (0.1 sec); 2: Supply of SiO precursor (0.3 sec); 3: Purge of SiO precursor (0.9 sec); 4: Supply of P dopant (0.3 sec); 5: Purge of P dopant (0.1 sec); 6: Application of RF power (0.2 sec)

Fig. 10

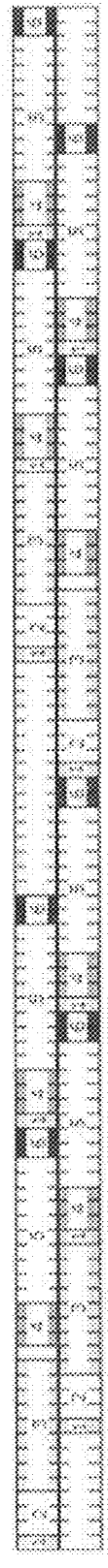

None: Purge without switching valves; 1: Purge wit switching valves (0.1 sec); 2: Supply of SiO precursor (0.3 sec); 3: Purge of SiO precursor (0.9 sec); 4: Supply of P dopant (0.3 sec); 5: Purge of P dopant (0.1 sec); 6: Application of RF power (0.2 sec)

Fig. 19

| | | Condition |
|---|---|---|
| Dopant Bottle 1 | | TMPI[*1] |
| Dopant Bottle 1 temp. | [deg.C] | 35 |
| Precurser Bottle 2 | | BDEAS[*2] |
| Precurser Bottle 2 temp. | [deg.C] | 50 |
| Carrier Ar (/RC) | [sccm] | 2000 |
| Dilution Ar(/RC) | [sccm] | 500 |
| O2 (/RC) | [sccm] | 500 |
| Seal He(/RC) | [sccm] | 100 |
| RC Press | [Pa] | 400 |
| RF(13.56MHz) | [W] | 200 |
| Electrode gap | [mm] | 7.5 |
| Susceptor Heater temp. | [deg C] | 300 |
| Shower Plate temp. | [deg C] | 150 |
| Wall temp. | [deg C] | 130 |

*1 Trimethyl phosphite
*2 Bisdiethylaminosilane

METHOD FOR PERFORMING UNIFORM PROCESSING IN GAS SYSTEM-SHARING MULTIPLE REACTION CHAMBERS

BACKGROUND OF THE INVENTION

1. Field of the Invention

The present invention generally relates to a method for performing uniform processing in multiple reaction chambers sharing a gas supply system.

2. Description of the Related Art

In order to increase throughput of processed wafers, multiple wafers are loaded in a reaction chamber and processed simultaneously, by executing batch programs. However, it is difficult to perform processing with high precision using batch programs. On the other hand, if a single wafer is loaded in a reaction chamber and processed, the process can be controlled with high precision, but throughput suffers. If multiple reaction chambers of the single-wafer processing type are combined and share a process gas supply system, by operating the multiple reaction chambers simultaneously, throughput can be increased. However, when the Multiple reaction chambers share a common process gas supply system provided with a common bottle (reservoir) containing a liquid precursor, and a vaporized precursor is supplied to the multiple reaction chambers simultaneously, because of differences in pipe length from the bottle to each reaction chamber, differences in conductance of the supply line for each reaction chamber, etc it is difficult to supply a vaporized precursor equally to all the multiple reaction chambers, creating variations among the reaction chambers in terms of deposition rate, film uniformity, film composition, etc. The above variation problem in the multiple reaction chambers of the single-wafer processing type can greatly be alleviated, by conducting the process in the multiple reaction chambers in sequence, i.e., starting the process in the multiple reaction chambers in sequence with a certain delay (supplying a vaporized precursor to the multiple reaction chambers in sequence at shifted timing) wherein the process is repeated in the sequence to process multiple wafers in the multiple reaction chambers. The above sequential process works well to reduce variations in film quality among the multiple reaction chambers if the precursor has a relatively low vapor pressure, i.e., the quantity of the precursor is relatively low and thus, the precursor can readily be purged from the gas supply system.

However, if the precursor has a high vapor pressure (e.g., trimethyl phosphate, TMPI, has a vapor pressure of 2.27 kPa at 25° C., whereas bisdiethyiaminosilance, BDEAS, has a vapor pressure of 0.436 kPa at 25° C.), the quantity of the precursor is large, i.e., it is difficult to fully purge the gas from the gas supply system. The present inventors discovered that when using a precursor having a high vapor pressure in a parallel cyclic processing system of multiple reaction chambers sharing a gas supply system, variations of film properties among the reaction chambers occurred depending on the order in which the reaction chambers started processing.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

Some embodiments provide a method for performing uniform processing in multiple reaction chambers comprising: (a) conducting a cycle constituted by steps in each reaction chamber according to the order of the reaction chambers at which the steps are conducted; and then (b) conducting the steps in each reaction chamber after changing the immediately prior order of the reaction chambers at which the steps are conducted; and then (c) repeating process (b) until a target treatment is complete at the multiple reaction chambers, said target treatment conducted on a substrate in each reaction chamber being the same. Above processes (a) to (c) can equally apply to a system comprising two or three or more reaction chambers without changing the principle of operation. Also, above processes (a) to (c) can equally apply to a process recipe including more than two steps in one cycle, i.e., one cyclic process unit.

In the above, by changing the order in which the reaction chambers are used for processing during the same target treatment, variations of film properties, for example, can effectively be suppressed. Changing the order of processing includes changing the order of the reaction chambers to which a precursor gas and/or a reactant gas is/are supplied, changing the order of the reaction chambers to which an RF power is applied, and/or changing the order of the reaction chambers in which purging is conducted. These changes can be independently conducted, and some of the steps can be conducted simultaneously. For example, the order of the reaction chambers to which a process gas is supplied is changed whereas an RF power is applied simultaneously to all the reaction chambers. In some embodiments, the repeating processes are those for forming a doped-film, a metal film, or a SiO film, or for trimming or etching a film. In some embodiments, because variations of film properties among reaction chambers can be controlled by changing the order of the reaction chambers in which a step in one cycle is conducted, by checking parameters indicative of variations of film properties downstream of the reaction chambers and feeding back the parameters to a control unit, a suitable order can be determined and the processing can be performed using the determined order, thereby improving uniformity of processing in all the reaction chambers. The above feedback control can be performed continuously.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 9 illustrates a detailed process sequence applied to a dual-chamber PEALD apparatus according to a comparative embodiment.

FIG. 10 illustrates a detailed process sequence applied to a dual-chamber PEALD apparatus according to an embodiment of the present invention.

FIG. 19 shows the conditions under which a film was deposited in Example 1.

DETAILED DESCRIPTION OF EMBODIMENTS

Figure 1:
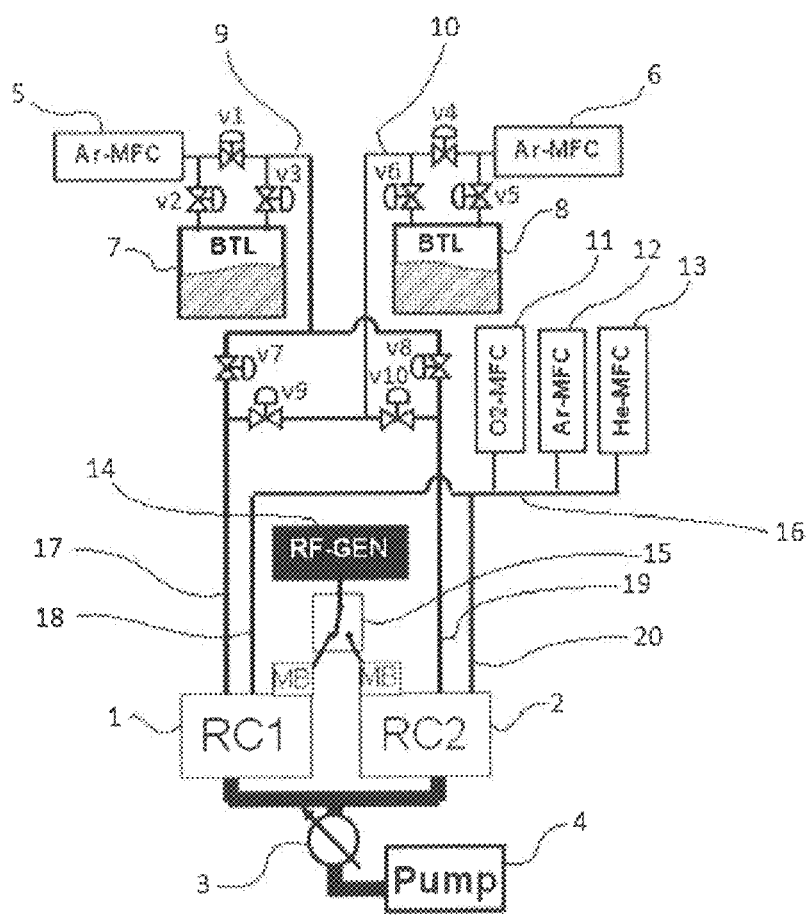
FIG. 1 is a schematic view of a dual-chamber plasma-enhanced atomic layer deposition (PEALD) apparatus to which an embodiment of the present invention is applied.

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of or consist of a precursor, a reactant gas, and a purge gas. The precursor and the reactant gas can react with each other in an excited state and can be introduced with another gas or a carrier gas such as a rare gas. A gas other than the process gas. i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface.

In this disclosure, "dual chambers" refers to two sections or compartments for processing wafers disposed closely to each other and viewed substantially as, e.g., positionally, structurally, functionally, and/or operationally, separated or isolated from each other, which include not only two separate chambers connected to each other side by side or vertically, but also two isolated regions disposed side by side or vertically in one common chamber. In this disclosure, a "module" refers to a standardized unit detachably attachable to a wafer-handling main chamber.

In this disclosure, any defined meanings do not necessarily exclude ordinary and customary meanings in some embodiments.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

An embodiment provides a method for performing uniform processing in multiple reaction chambers sharing a first gas source and a second gas source, each reaction chamber having a gas inlet line through which a first gas from the first gas source, a second gas from the second gas source, and a purge gas are introduced into the reaction chamber, wherein a target treatment conducted in each reaction chamber is the same, said method comprising; (i) supplying the first gas to the multiple reaction chambers through the respective gas inlet lines in a supply order where the first gas is supplied to one of the multiple reaction chambers and then to another of the multiple reaction chambers; (ii) supplying the second gas to the multiple reaction chambers through the respective gas inlet lines in a supply order where the second gas is supplied to one of the multiple reaction chambers and then to another of the multiple reaction chambers; (iii) supplying the purge gas to the multiple reaction chambers through the respective gas inlet lines after every supply of the first gas and after every supply of the second gas so as to purge the first gas and the second gas, respectively, from the multiple reaction chambers and the gas inlet lines, and (iv) continuously repeating steps (i) to (iii) to complete the target treatment in the multiple reaction chambers, wherein the supply order of at least one of the first gas or the second gas is changed when the supply of the at least one of the first gas or the second gas is repeated. In this disclosure, "continuously" refers to without breaking a vacuum, without interruption as a timeline, without changing treatment conditions, or immediately thereafter.

The multiple reaction chambers may be two or three or more reaction chambers disposed side by side or vertically. For example, a dual-chamber reactor which may be a module may be used. The multiple reaction chambers share a first gas source and a second gas source, and each reaction chamber has a gas inlet line through which a first gas from the first gas source, a second gas from the second gas source, and a carrier gas (also functions as a purge gas) are introduced into the reaction chamber. Since at least part of a gas supply system is shared by the multiple reaction chambers, a problem may occur in evenly dividing a gas flow to the multiple reaction chambers when supplying a gas simultaneously to the multiple reaction chambers due to the differences in the piping length from the gas source to each reaction chamber and the differences in conductance of the piping. Thus, typically, a gas is supplied to the multiple reaction chambers in sequence without dividing a gas flow into multiple paths. However, even when supplying a gas in sequence, a flow path is different among the multiple reaction chambers, resulting in non-uniform gas supply among the multiple reaction chambers.

In some embodiments, the multiple reaction chambers share an exhaust system, and the pressure of each reaction chamber is controlled using the exhaust system.

In some embodiments, the multiple reaction chambers each comprise another gas line, through which an additive gas or inert gas is supplied to the multiple reaction chambers.

Typically, when the first gas source and the second gas source include bottles storing liquid compounds, respectively, vaporized gases of which are the first gas and the second gas, respectively, the difference in gas flow among the multiple reaction chambers may become more problematic since some precursors and reactants have a high vapor pressure, and thus, the quantity of the compounds is high, i.e., it is not easy to purge these compounds evenly from the multiple reaction chambers. In some embodiments, a first gas line from the first gas source is ramified and connected to each of the gas inlet lines of the multiple reaction chambers, and a second gas line from the second gas source is ramified and connected to each of the gas inlet lines of the multiple reaction chambers, wherein the first gas and the purge gas are introduced to the multiple reaction chambers through the first gas line, the lines ramified therefrom, and the gas inlet lines of the multiple reaction chambers, while the second gas and the purge gas are introduced to the multiple reaction chambers through the second gas line, the lines ramified therefrom, and the gas inlet lines of the multiple reaction chambers, wherein each ramified line is provided with a valve. In the above, the gas flows defined in steps (i) to (iii) can effectively be controlled using each valve. In some embodiments, the purge gas continuously flows alone or with the first gas through the first gas line, while the purge gas continuously flows alone or with the second gas through the second gas line. Since the first gas, the purge gas associated with the first gas, the second gas, and the purge gas associated with the second gas pass through the gas inlet line of each reaction chamber, a gas flow switching unit is required, in the gas flow switching unit, the route where each gas passes through the unit is different for each reaction chamber. Thus, when the process order of the reaction chambers to which each gas is supplied is fixed, the difference in gas flow among the reaction chambers is also fixed. By conducting steps (i) to (iv) described above, the difference in gas flow among the reaction chambers can be minimized.

The target treatment conducted in each reaction chamber is the same. In some embodiments, the repeating processes for the target treatment are those for forming a doped-film, a metal film, or a SiO film, or for trimming or etching a film. The number of gases, the type of gas, flow rate, gas excitation method, temperature, pressure, etc. can be determined according to the target treatment. A skilled artisan in the art can readily provide such conditions as a matter of routine experimentation.

In some embodiments, one cycle is comprised of steps (i) to (iii), and in step (Iv), the cycle is repeated wherein the supply order of at least one of the first gas or the second gas is changed per cycle. In some embodiments, the supply order of the second gas is changed per cycle while the supply order of the first gas is unchanged. In other embodiments, the supply order of each of the first gas and the second gas is changed per cycle. In some embodiments, one cycle is comprised of steps (i) to (iii), and step (ii) is repeated in the cycle wherein the supply order of the second gas is changed when step (ii) is repeated in the cycle, said cycle being repeated in step (iv). In some embodiments, a supply rate of the first gas is two or more times higher than a supply rate of the second gas.

In some embodiments, the method further comprises (iiia) applying RF power in the multiple reaction chambers after every step (iii). RF power can be applied to the multiple reaction chambers sequentially or simultaneously, in some embodiments, the multiple reaction chambers share an RF generator which generates RF power. In some embodiments, the target treatment is deposition of a film by plasma-enhanced atomic layer deposition (PEALD). Alternatively, the target treatment may be conducted by thermal ALD, radical-enhanced ALD, cyclic CVD, or any other cyclic processing, wherein a cycle is repeated 20 to 300 times (typically, 50 to 200 times), for example, to complete the target treatment.

In another aspect, an embodiment provides a method for performing uniform processing in multiple reaction chambers comprising: (a) conducting a cycle constituted by steps in each reaction chamber according to the order of the reaction chambers at which the steps are conducted; and then (b) conducting the steps in each reaction chamber after changing the immediately prior order of the reaction chambers at which the steps are conducted; and then (c) repeating process (b) until a target treatment is complete at the multiple reaction chambers, said target treatment conducted on a substrate in each reaction chamber being the same.

In some embodiments, the steps include a step of supplying a first gas and a step of supplying a second gas. In some embodiments, the first and second gases are supplied to one of the reaction chambers through a first common gas inlet line, and the first and second gases are supplied to another of the reaction chambers through a second common gas inlet line, wherein the first gas is supplied to a first gas line which is ramified and connected to the first and second common as inlet lines, and the second gas is supplied to a second gas line which is ramified and connected to the first and second common gas inlet lines.

Another embodiment provides a method for performing uniform processing in a first reaction chamber and a second reaction chamber wherein a target treatment conducted on a substrate in each reaction chamber is the same, wherein the target treatment is conducted by repeating step A and step B in this sequence, wherein steps A and B which are conducted at the first reaction chamber are referred to as steps A1 and B1, and steps A and B which are conducted at the second reaction chamber are referred to as steps A2 and B2, said method comprising: (a) conducting steps A1, A2, B1, and B2 in this order; and then (b) conducting the steps after changing the immediately prior order; and then (c) repeating process (b) until the target treatment is complete at the first and second reaction chambers.

The embodiments will be explained with reference to the drawings. The drawings are not intended to limit the present invention.

FIG. 1 is a schematic view of a dual-chamber plasma-enhanced atomic layer deposition (PEALD) apparatus to which an embodiment of the present invention is applied. The apparatus combines a plasma reactor and flow control valves, desirably in conjunction with controls programmed to conduct the sequences described below, which can be used in an embodiment of the present invention. In this figure, reaction chamber 1 (RC1) and reaction chamber 2 (RC2) are provided side by side and constitute a module. The reaction chambers 1, 2 share a bottle 7 (first gas source) and a bottle 8 (second gas source), and also an auto pressure controller 3 connected to an exhaust pump 4. Further, the reaction chambers 1, 2 share an RF generator 14. When the first gas is supplied to the reaction chamber 1 or the reaction chamber 2, a carrier gas (e.g., Ar) is provided through a mass flow controller 5 to the bottle 7 which contains a liquid for the first gas and is equipped with a heater, where a valve v2 is open whereas a valve v1 is closed. The carrier gas enters the bottle 7 and flows out therefrom with the vaporized liquid for the first gas, to a first gas line 9 via a valve v3. The first gas is constituted by a mixture of the active material (vaporized liquid for the first gas) and the carrier gas. The first gas line 9 is ramified to a gas inlet line 17 connected to the reaction chamber 1 and a gas inlet line 19 connected to the reaction chamber 2. The first gas flows through the gas line 9 and the gas inlet line 17 via a valve v7 provided between the gas line 9 and the gas inlet line 17 (a valve v8 provided between the gas line 9 and the gas inlet line 19 is closed), and enters the reaction chamber 1. When the valve v7 is closed and the valve v8 is open, the first gas flows through the gas line 9 and the gas inlet line 19 via the valve v8, and enters the reaction chamber 2. When the valve v1 is open and the valve v2 is closed, only the carrier gas flows through the gas line 9 and enters the reaction chamber 1 or 2 via the same route as the first gas, wherein the carrier gas functions as a purge gas.

When the second gas is supplied to the reaction chamber 1 or the reaction chamber 2, a carrier gas (e.g., Ar) is provided through a mass flow controller 6 to the bottle 8 which contains a liquid for the second gas and is equipped with a heater, where a valve v5 is open whereas a valve v4 is closed. The carrier gas enters the bottle 8 and flows out therefrom with the vaporized liquid for the second gas, to a second gas line 10 via a valve v6. The second gas is constituted by a mixture of the active material (vaporized liquid for the second gas) and the carrier gas. As with the first gas line 9, the second gas line 10 is ramified to the gas inlet line 17 connected to the reaction chamber 1 and the gas inlet line 19 connected to the reaction chamber 2, wherein the first and second gas lines 9, 10 share the gas inlet lines 17, 19. The second gas flows through the gas line 10 and the gas inlet line 17 via a valve v9 provided between the gas line 10 and the gas inlet line 17 (a valve v10 provided between the gas line 10 and the gas inlet line 19 is closed), and enters the reaction chamber 1. When the valve v9 is closed and the valve v10 is open, the second gas flows through the gas line 10 and the gas inlet line 19 via the valve v10, and enters reaction chamber 2. When the valve v4 is open and the valve v5 is closed, only the carrier gas flows through the gas line 10 and enters the reaction chamber 1 or 2 via the same route as the second gas, wherein the carrier gas functions as a purge gas.

Additionally, separately from the first and second gases, oxygen, argon, and helium, for example, can be supplied from an oxygen mass flow controller 11, argon mass flow controller 12, and helium mass flow controller 13, respectively, to the reaction chamber 1 and 2 as necessary through gas lines 18 and 20, respectively, via a gas line 16. Further, RF power can be applied from the RF generator 14 to the reaction chamber 1 or 2 using a switch 15 via respective matching boxes (MB). The pressure in the reaction chambers 1 and 2 is controlled by the auto pressure controller 3.

Although FIG. 1 illustrates the apparatus comprising two bottles 7, 8, one RE generator 14, one auto pressure controller 3, one pump 4, and four gas lines 17, 18, 19, 20, the apparatus can further comprise one remote plasma unit. Also, the apparatus can further comprise one or more additional reaction chambers, one or more bottles, and two or more gas lines. The RF generator can be connected to each reaction chamber separately. For an apparatus for thermal cyclic processing, no RF generator is installed.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

In the above, an area including the valves v7, v8, v9, and v10 constitutes a gas flow switching unit provided between the gas lines 9, 10 and the gas inlet lines 17, 19. By manipulating the valves v7 to v10 associated with the valves v1 to v6, which gas is supplied to which reaction chamber can be controlled, and also the order of the reaction chambers 1, 2 to which the gas is supplied can be controlled.

Figure 11:
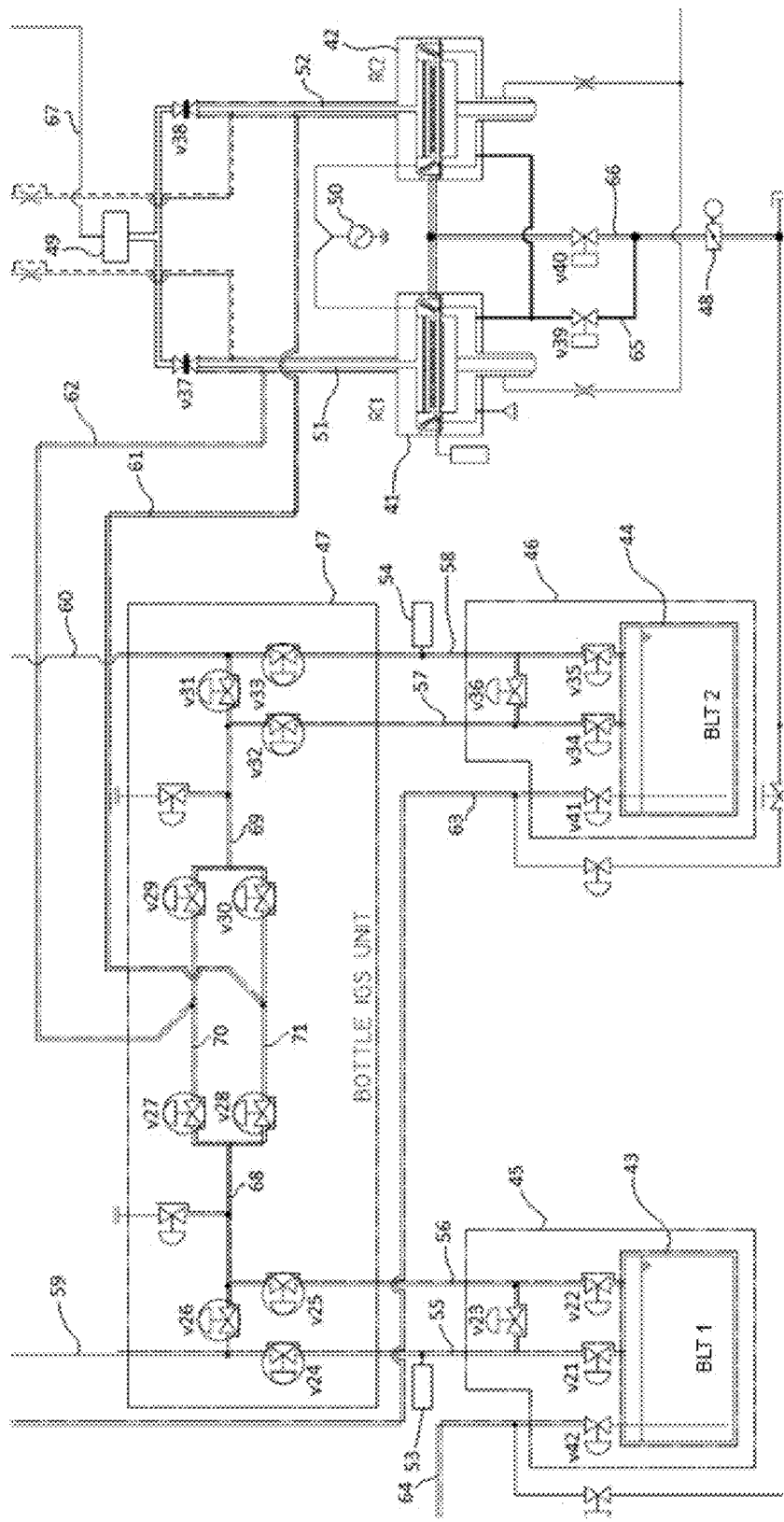
FIG. 11 is a schematic view of a dual-chamber PEALD apparatus to which an embodiment of the present invention is applied.

FIGS. 11 to 16 illustrate how the gas flow switching unit causes uneven flow between two reaction chambers according to an embodiment of the present invention. FIG. 11 is a schematic view of a dual-chamber PEALD apparatus to which an embodiment of the present invention is applied. In the figure, a two-dot chain line represents a portion equipped with a heating element for temperature control, and a broken line represents a portion covered with a heat-insulating material without a heating element. In this figure, the apparatus comprises a bottle unit 45 including a bottle (BLT 1) 43 containing a liquid material (e.g., a phosphorous dopant); a bottle unit 46 including a bottle (BLT 2) 44 containing a liquid material (e.g., a Si-containing precursor); a bottle-integrated gas system unit (Bottle IGS Unit) 47 for switching gas flow; a first reaction chamber (RC1) 41; a second reaction chamber (RC2) 42; an RF generator 50; and a remote plasma unit 49. A gas flows into the first reaction chamber 41 through a gas inlet line 51, whereas a gas flows into the second reaction chamber 42 through a gas inlet line 52, and a gas is discharged from a reaction space of each reaction chamber 41, 42 through an exhaust line 66 with a valve v40, and from a bottom of each reaction chamber 41, 42 through an exhaust line 65 with a valve v39. The exhaust line 65 is merged to the exhaust line 66, and then the gases are discharged through an auto pressure controller 48. A process gas is fed to the gas inlet line 51 through a gas line 62, and a process gas is fed to the gas inlet line 52 through a gas line 61. A gas is supplied to the remote plasma unit 49 through a line 67 and excited, and then fed to the gas inlet lines 51, 52 through valves v37 and v38, respectively. An additive gas, inert gas, etc. are fed to the gas inlet lines 51, 52 through lines marked with broken lines. RF power is applied to each reaction chamber 41, 42 from the RF power generator 50. The integrated gas system 47 is a unit for switching gas flow, wherein a first carrier gas is fed to the integrated gas system 47 through a gas line 59, and a second carrier gas is fed to the integrated gas system 47 through a gas line 60. The first carrier gas flows out from the integrated gas system 47 to the bottle unit 45 through a gas line 55 with a pressure transducer 53, and a gas flows into the integrated gas system 47 from the bottle unit 45 through a gas line 56. The second carrier gas flows out from the integrated gas system 47 to the bottle unit 46 through a gas line 58 with a pressure transducer 54, and a gas flows into the integrated gas system 47 from the bottle unit 46 through a gas line 57. A process gas flows out from the integrated gas system 47 through the gas line 62 toward the first reaction chamber 41, whereas a process gas flows out from the integrated gas system 47 through the gas line 61 toward the second reaction chamber 42. A liquid material is supplied to the bottle 43 through a line 64, and another liquid material is supplied to the bottle 44 through a line 63. A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

Figure 12:
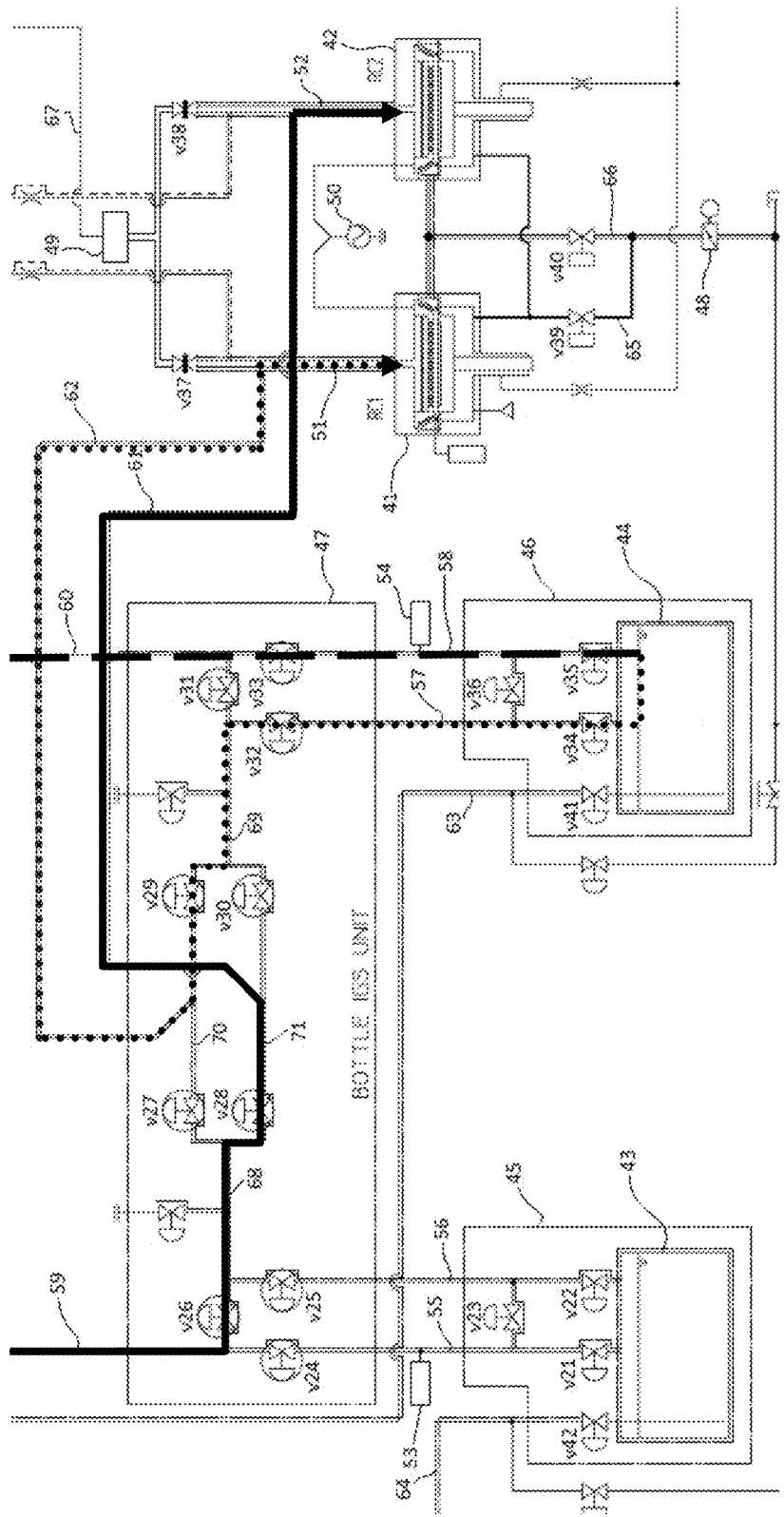
FIG. 12 illustrates step 1 of a process sequence in the dual-chamber PEALD apparatus illustrated in FIG. 11 according to an embodiment of the present invention.

FIG. 12 illustrates step 1 of a process sequence in the dual-chamber PEALD apparatus illustrated in FIG. 11 according to an embodiment of the present invention. In step 1, the first carrier gas (represented by a thick solid line) flows into the integrated gas system 47 through the gas line 59 and flows out therefrom through the gas line 61 via a line 68 with a valve v26 and a line 71 with a valve v28 where a valve v24, a valve v25, and a valve v27 are closed. The first carrier gas is then fed as a purge gas to the second reaction chamber 42 through the gas inlet line 52. The second carrier gas (represented by a thick broken line) flows into the integrated gas system 47 through the gas line 60 and flows out therefrom via a valve v33 to the bottle unit 46 through the gas line 58 where a valve v31 is closed. The second carrier as enters the bottle 44 via a valve v35 and is discharged therefrom with a vaporized precursor (as a precursor represented by a thick dotted line with circular dots) through a gas line 57 via a valve v34 where a valve v36 is closed. The precursor flows into the integrated gas system 47 through the gas line 57 via a valve v32 and flows out therefrom through the gas line 62 via a line 69 and a line 70 with a valve v29 where a valve v30 is closed. The precursor is then fed to the first reaction chamber 41 through the gas inlet line 51.

Figure 13:
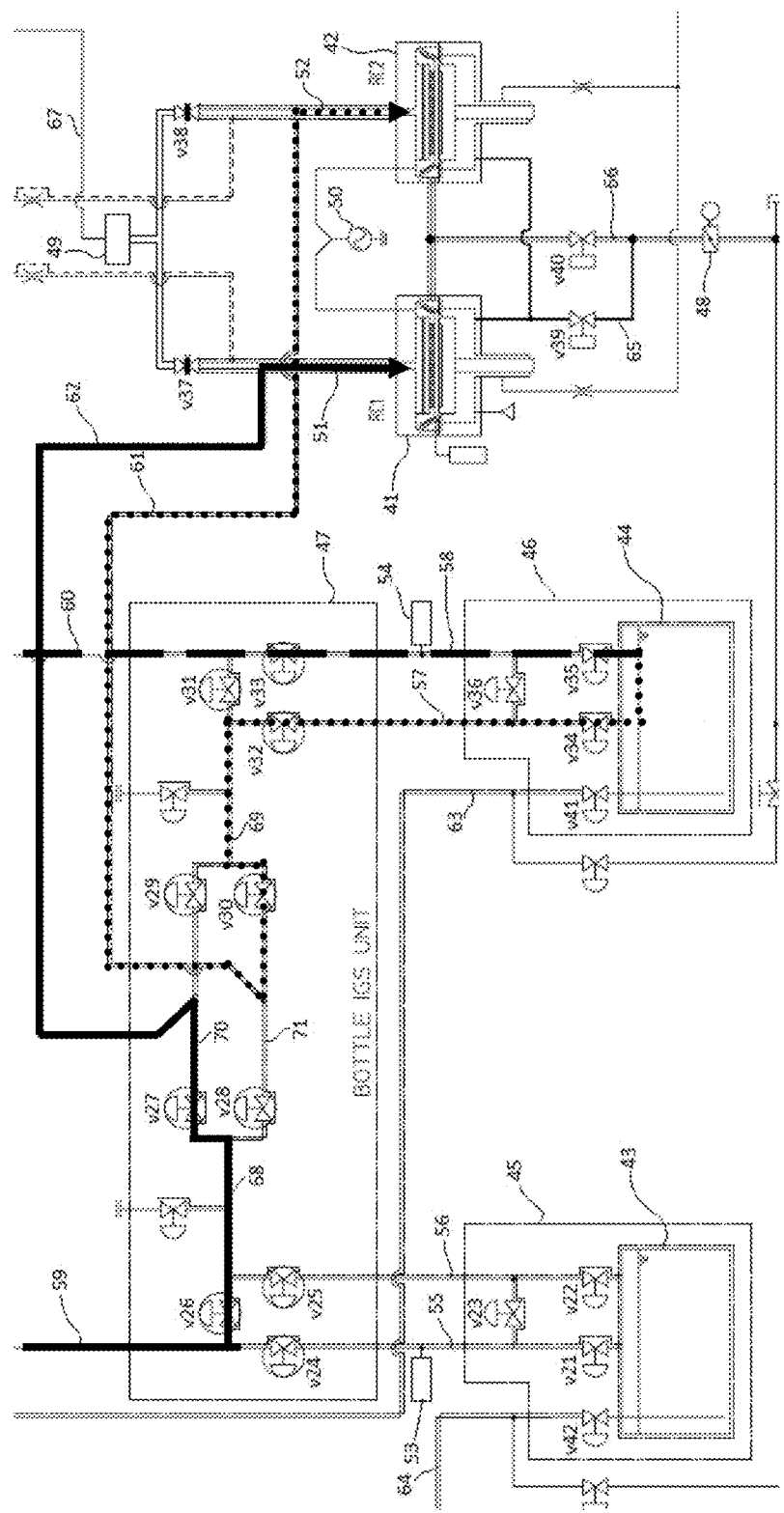
FIG. 13 illustrates step 2 of a process sequence in the dual-chamber PEALD apparatus illustrated in FIG. 11 according to an embodiment of the present invention.

FIG. 13 illustrates step 2 of a process sequence in the dual-chamber PEALD apparatus illustrated in FIG. 11 according to an embodiment of the present invention. In step 2, the valve v27 is open while the valve v28 is closed so that the first carrier gas is fed to the first reaction chamber 41 in place of the second reaction chamber 42 through the gas line 70, the gas line 62, and the gas inlet line 51. Also, the valve v30 is open while the valve v29 is closed so that the precursor is fed to the second reaction chamber 42 in place of the first reaction chamber 41 through the gas line 71, the gas line 61, and the gas inlet line 52.

Figure 14:
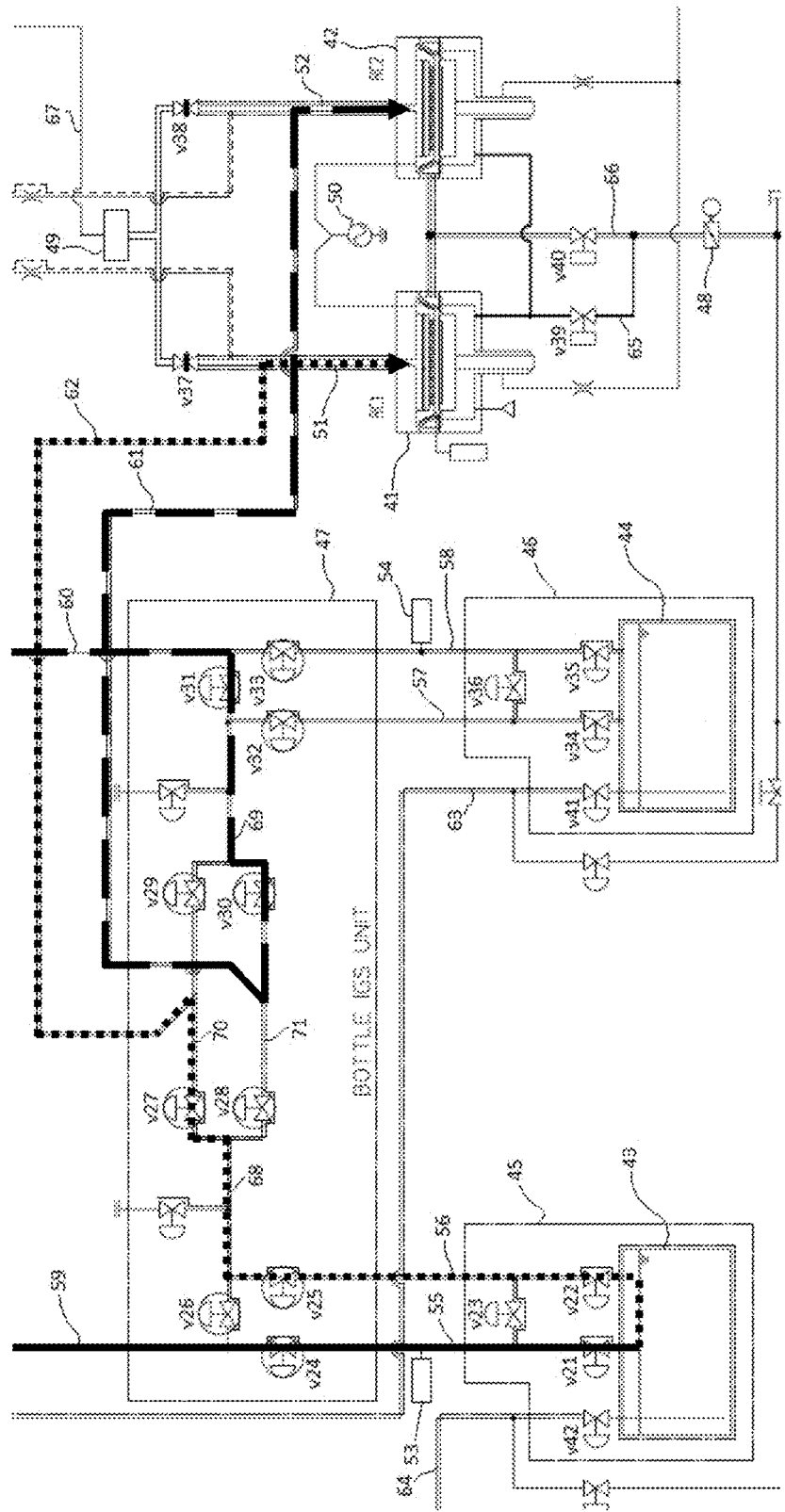
FIG. 14 illustrates step 3 and step 5 of a process sequence in the dual-chamber PEALD apparatus illustrated in FIG. 11 according to an embodiment of the present invention.

FIG. 14 illustrates step 3 of a process sequence in the dual-chamber PEALD apparatus illustrated in FIG. 11 according to an embodiment of the present invention, in step 3, the valve v26 is closed while the valve v24 is open so that the first carrier gas flows out from the integrated gas system 47 via the valve v24 to the bottle unit 45 through the gas line 55. The first carrier gas enters the bottle 43 via a valve v21 and is discharged therefrom with a vaporized dopant (as a dopant represented by a thick dotted line with square dots) through the gas line 56 via a valve v22 where a valve v23 is closed. The dopant flows into the integrated gas system 47 through the gas line 56 via a valve v2.5 and flows out therefrom through the gas line 62 via the line 68 and the line 70 with the valve v27 where the valve v28 is closed. The dopant is then fed to the first reaction chamber 41 through the gas inlet line 51, in place of the second reaction chamber 42. Also, the valve v31 is open while the valve v33 is closed so that the second carrier gas is fed to the second reaction chamber 42 through the gas line 69, the gas line 71 with the valve v30, the gas line 61, and the gas inlet line 52.

Figure 15:
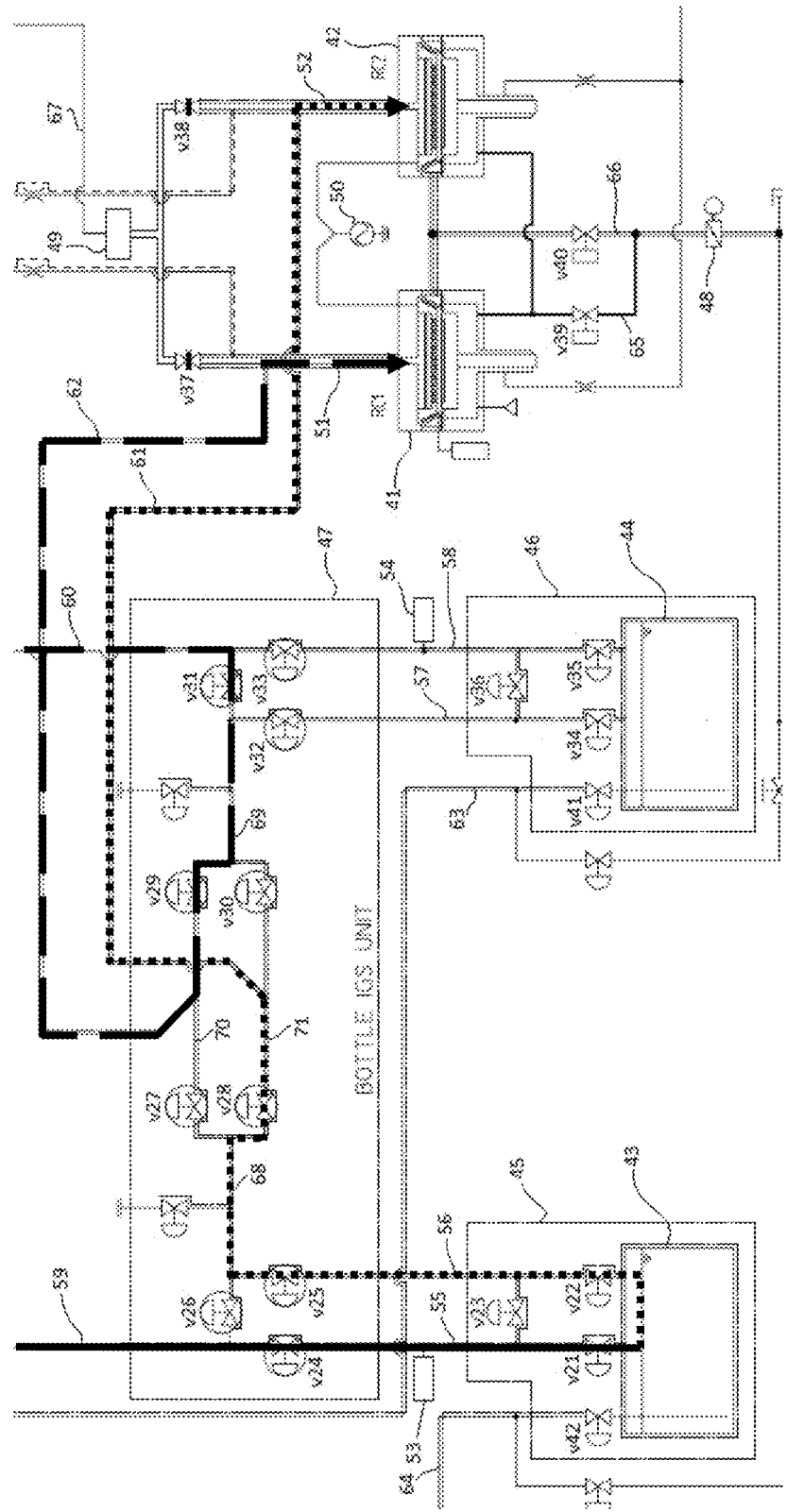
FIG. 15 illustrates step 4 and step 6 of a process sequence in the dual-chamber PRAM apparatus illustrated in FIG. 11 according to an embodiment of the present invention.

FIG. 15 illustrates step 4 of a process sequence in the dual-chamber PEALD apparatus illustrated in FIG. 11 according to an embodiment of the present invention. In step 4, the valve v27 is closed while the valve v28 is open so that the dopant is fed to the second chamber 42 in place of the first reaction chamber 41 through the gas line 71, the gas line 61, and the gas inlet line 52. Also, the valve v30 is closed while the valve v29 is open so that the second carrier gas is fed as a purge gas to the first reaction chamber 41 in place of the second reaction chamber 42 through the gas line 70 the gas line 62, and the gas inlet line 51.

Step 5 is substantially the same as step 3 illustrated in FIG. 14 so that the dopant is fed to the first reaction chamber 41, whereas the purge gas is fed to the second reaction chamber 42.

Step 6 is substantially the same as step 4 illustrated in FIG. 15 so that the dopant is fed to the second reaction chamber 42, whereas the purge gas is fed to the first reaction chamber 41.

Figure 16:
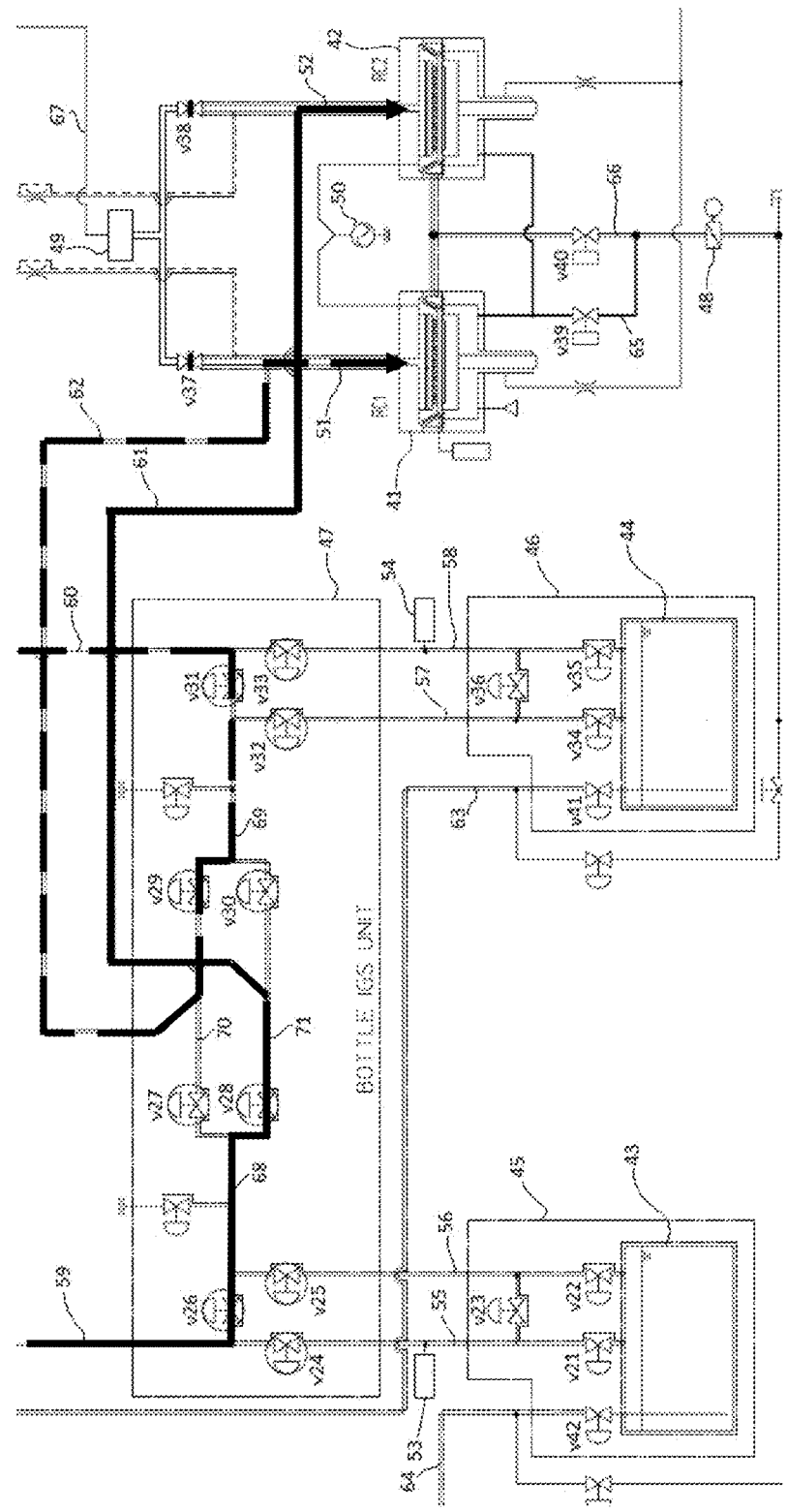
FIG. 16 illustrates step 7 of a process sequence in the dual-chamber PEALD apparatus illustrated in FIG. 11 according to an embodiment of the present invention.

FIG. 16 illustrates step 7 of a process sequence in the dual-chamber PEALD apparatus illustrated in FIG. 11 according to an embodiment of the present invention. In step 6, the valve v26 is open while the valve v24 is closed so that the first carrier gas is fed as a purge gas to the second reaction chamber 42 through the gas line 68, the gas line 71, and the gas line 61, and the gas inlet line 52.

In the above, the dopant gas has a higher vapor pressure than the precursor, and thus, it is more difficult to purge the dopant from the reaction chamber than to purge the precursor. In step 3 (FIG. 14), the dopant is fed to the first reaction chamber 41, and in step 4 (FIG. 15), the purge has is fed to the first reaction chamber 41. That is, the gas fed to the first reaction chamber 41 is changed from the dopant to the purge gas. Since the dopant is fed to the first reaction chamber 41 by using the first carrier gas, whereas the purge gas is the second carrier gas, the above change (changing from the dopant to the purge gas at the first reaction chamber) is accomplished by switching the used carrier gas from the first carrier has to the second carrier gas, i.e., when the dopant is fed to the first reaction chamber 41, a first half of the gas line 70 with the valve v27 is used (FIG. 14), while when the purge gas is fed to the first reaction chamber 41, a second half of the has line 70 with the valve v29 is used (FIG. 15), and thus, the different parts of the has line 70 is used.

In contrast, in step 6 (FIG. 15), the dopant is fed to the second reaction chamber 42, and in step 7 (FIG. 16), the purge gas is fed to the second reaction chamber 42. That is, the gas fed to the second reaction chamber 42 is changed from the dopant to the purge gas. Since the dopant is fed to the second reaction chamber 42 by using the first carrier gas, whereas the purge gas is also the first carrier gas, the above change (changing from the dopant to the purge gas at the second reaction chamber) is accomplished by switching the gas flow pass from the one passing through the bottle 43 to the one bypassing the bottle 43 using the same first carrier gas, i.e., when the dopant is fed to the second reaction chamber 42, a first half of the gas line 71 with the valve v28 is used (FIG. 15), and also when the prune gas is fed to the second reaction chamber 42, the first half of the gas line 71 with the valve v28 is used (FIG. 16), and thus, the same part of the gas line 71 is used. For the reason above, when the second reaction chamber 42 is purged after the dopant is fed, the purge gas carries some residual dopant left in the gas line 71 to the second reaction chamber 42. This occurs only in the second reaction chamber (when the feeding order is changed, the above problem occurs only in the first reaction chamber). As a result, deviations of film properties occur between the first and second reaction chambers.

In some embodiments, by changing the order of the reaction chambers to which the gas is fed, the above problem can effectively be resolved.

Figure 2:
FIG. 2 illustrates a schematic process sequence applied to a dual-chamber PEALD apparatus according to a comparative embodiment.
Figure 3:
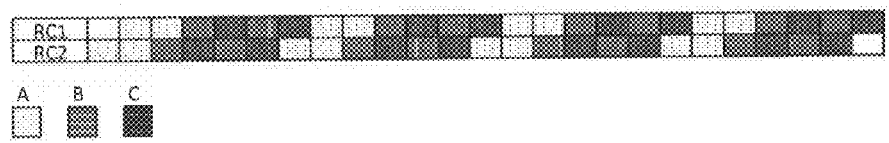
FIG. 3 illustrates a schematic process sequence applied to a dual-chamber PEALD apparatus according to a comparative embodiment.

FIG. 2 illustrates a schematic process sequence applied to a dual-chamber PEALD apparatus according to a comparative embodiment. A, B, and C represent process A (e.g., gas supply), process B (e.g., gas supply), and process C (e.g., RF application), respectively. In this sequence, a cycle constituted by A, A, B, C, B, and C starts always from the reaction chamber 1 (RC1), followed by the reaction chamber 2 (RC2). Thus, the above discussed problem, deviations of film properties between the reaction chambers, occurs. FIG. 3 illustrates a schematic process sequence applied to a dual-chamber PEALD apparatus according to a comparative embodiment. In this sequence, the cycle starts always from the second reaction chamber, followed by the first reaction chamber, and thus, the same problem occurs.

Figure 4:
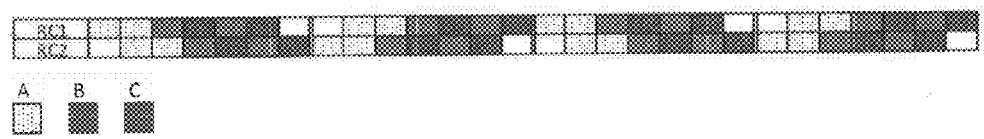
FIG. 4 illustrates a schematic process sequence applied to a dual-chamber PEALD apparatus according to another embodiment of the present invention.

FIG. 4 illustrates a schematic process sequence applied to a dual-chamber PEALD apparatus according to another embodiment of the present invention. A blank square other than A, B, or C represents purging without specific treatment, in this sequence, the first time, the cycle starts from the first reaction chamber, but the second time, the cycle starts from the second reaction chamber, i.e., the order of the reaction chambers at which the cycle starts first is changed per cycle. That is, the cycle starts alternately at the first and second reaction chambers. By starting the cycle alternately at the first and second reaction chambers, the problem of reactor-to-reactor deviation can effectively be resolved.

Figure 5:
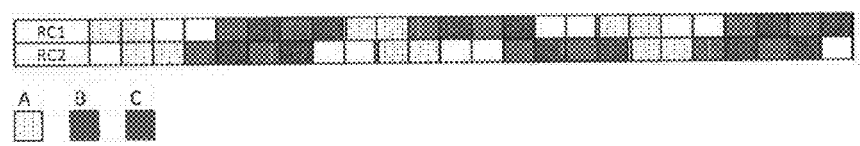
FIG. 5 illustrates a schematic process sequence applied to a dual-chamber PEALD apparatus according to still another embodiment of the present invention.

FIG. 5 illustrates a schematic process sequence applied to a dual-chamber PEALD apparatus according to still another embodiment of the present invention. In this sequence, process A is started always from the first reaction chamber, but process B and C start alternately from the second and first reaction chambers. By starting only a part of the cycle alternately at the first and second reaction chambers, the problem of reactor-to-reactor deviation can effectively be resolved.

Figure 6:
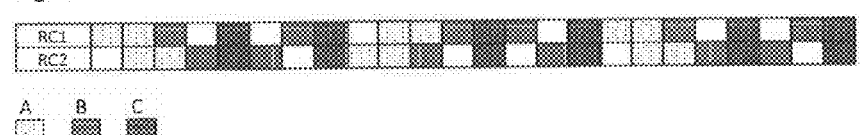
FIG. 6 illustrates a schematic process sequence applied to a dual-chamber PEALD apparatus according to yet another embodiment of the present invention.

FIG. 6 illustrates a schematic process sequence applied to a dual-chamber PEALD apparatus according to yet another embodiment of the present invention. In this sequence, process C is conducted simultaneously at the first and second reaction chambers, and process A is started alternately from the first and second reaction chambers, and process B is also started alternately from the first and second reaction chambers, but independently of process A. By starting parts of the cycle alternately and independently at the first and second reaction chambers (also starting a part of the cycle simultaneously at the first and second reaction chambers), the problem of reactor-to-reactor deviation can effectively be resolved.

Figure 7:
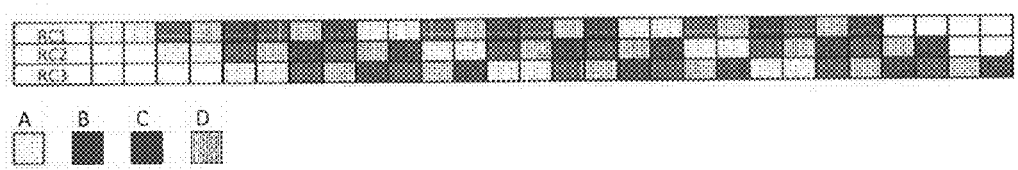
FIG. 7 illustrates a schematic process sequence applied to a triple-chamber PEALD apparatus according to a comparative embodiment.
Figure 8:
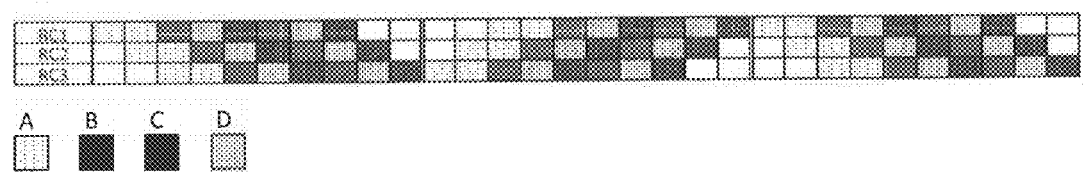
FIG. 8 illustrates a schematic process sequence applied to a triple-chamber PEALD apparatus according to an embodiment of the present invention.

FIG. 7 illustrates a schematic process sequence applied to a triple-chamber PEALD apparatus according to a comparative embodiment. A, B, C, and D represent process A (e.g., gas supply), process B (e.g., gas supply), process C gas supply), and process D (e.g., RF application), respectively. In this sequence, a cycle constituted by A, A, B, D, C, B, D, and C starts always from the reaction chamber 1 (RC1), followed by the reaction chamber 2 (RC2) and the reaction chamber 3 (RC3). Thus, the above discussed problem, deviations of film properties among the reaction chambers, occurs. FIG. 8 illustrates a schematic process sequence applied to a triple-chamber PEALD apparatus according to an embodiment of the present invention. In this sequence, the first time, the cycle starts from the first reaction chamber, but the second time, the cycle starts from the third reaction chamber, i.e., the order of the reaction chambers at which the cycle starts first is changed per cycle. That is, the cycle starts alternately at the first and third reaction chambers. By starting the cycle alternately at the first and third reaction chambers, the problem of reactor-to-reactor deviation can effectively be resolved.

FIG. 9 illustrates a detailed process sequence applied to a dual-chamber PEALD apparatus according to a comparative embodiment. This detailed sequence corresponds to the schematic sequence illustrated in FIG. 2. In this sequence, blank (no number) represents purge without switching valves; "1" represents purge with switching valves (0.1 sec); "2" represents supply of SiO precursor (0.3 sec); "3" represents purge of SiO precursor (0.9 sec); "4" represents supply of P (phosphorous) dopant (0.3 sec); "5" represents purge of P dopant (0.1 sec); and "6" represents application of RF power (0.2 sec). In this sequence, in the first reaction chamber (the upper sequence), after process 4 (supply of P dopant), the purging (process 5) starts using the same carrier gas, and thus, some residual dopant may be introduced into the first reaction chamber. However, the purging using the same carrier gas lasts only for 0.4 seconds, and thereafter, the carrier gas is switched to a different carrier gas which does not contain residual dopant. In contrast, in the second reaction chamber (the lower sequence), after process 4 (second occurrence), the purging (process 5) starts using the same carrier gas, and lasts for 1.0 seconds because no carrier gas switching is conducted during the above process 5. Thus, more residual dopant may be introduced into the second reaction chamber than in the first reaction chamber, causing reactor-to-reactor deviations.

FIG. 10 illustrates a detailed process sequence applied to a dual-chamber PEALD apparatus according to an embodiment of the present invention. This detailed sequence corresponds to the schematic sequence illustrated in FIG. 4. In this sequence, the cycle starts alternately from the first and second reaction chambers, and thus, the above problem can effectively be resolved.

In some embodiments, the gas supply system disclosed in U.S. patent application publication No. 2014/0033978 can be used, the disclosure of which is incorporated herein by reference in its entirety.

In some embodiments, because variations of film properties among reaction chambers can be controlled by changing the order of the reaction chambers in which at least one step in one cycle is conducted, by checking parameters indicative of variations of film properties downstream of the reaction chambers and feeding back the parameters to a control unit, the suitable order can be determined and the processing can be performed using the determined order, thereby improving uniformity of processing in all the reaction chambers. The above feedback control can be performed continuously. For example, SPOES (Self Plasma OES, product name, sold by Manoteck Inc., South Korea) or a self plasma monitoring sensor installed downstream of a reaction chamber can be used for the above purpose.

EXAMPLE 1

A phosphorous silicon glass (PSG) film was formed on a substrate (Φ300 mm) by PEALD under the conditions shown in FIG. 19 using the PEALD apparatus illustrated in FIG. 1. The sequence of cycles of PEALD was that shown in FIG. 9 (Comparative Example) and in FIG. 10 (Example 1). As a precursor, bisdiethylaminosilane (BDEAS) was used, and as a dopant, trimethylphosphite (TMPI) was used, wherein the vapor pressure of the dopant was about 3.5 times higher than that of the precursor.

Figure 17:
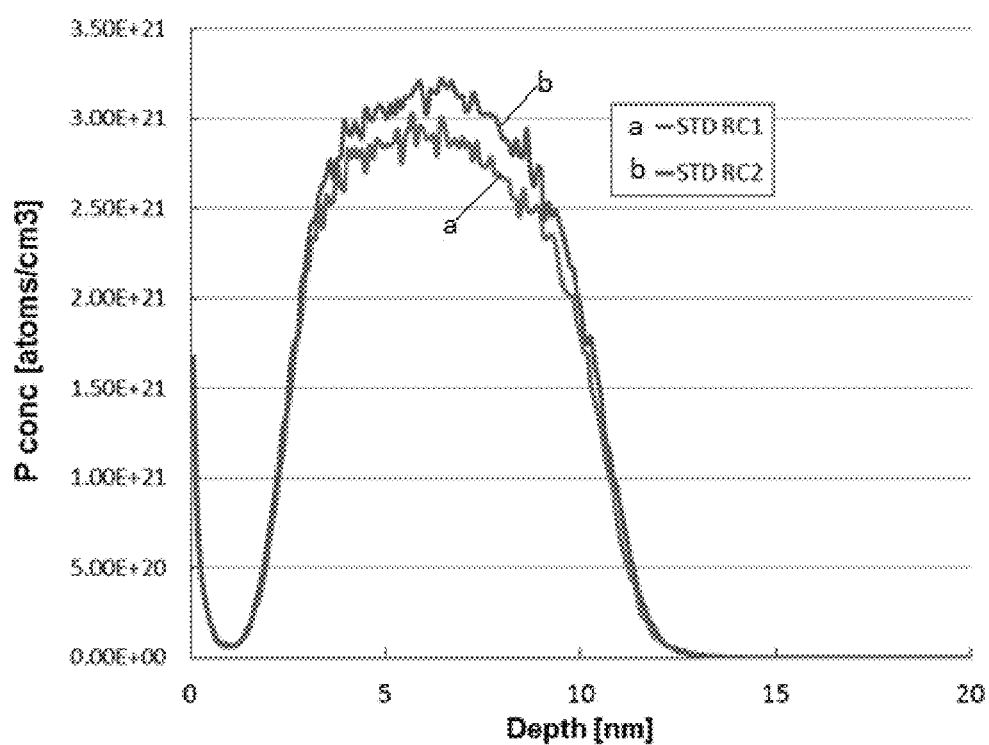
FIG. 17 is a graph showing a phosphorous concentration of a phosphorus silicon glass (PSG) film in a depth direction which was deposited in each reaction chamber of a dual-chamber PEALD apparatus according to a comparative embodiment.
Figure 18:
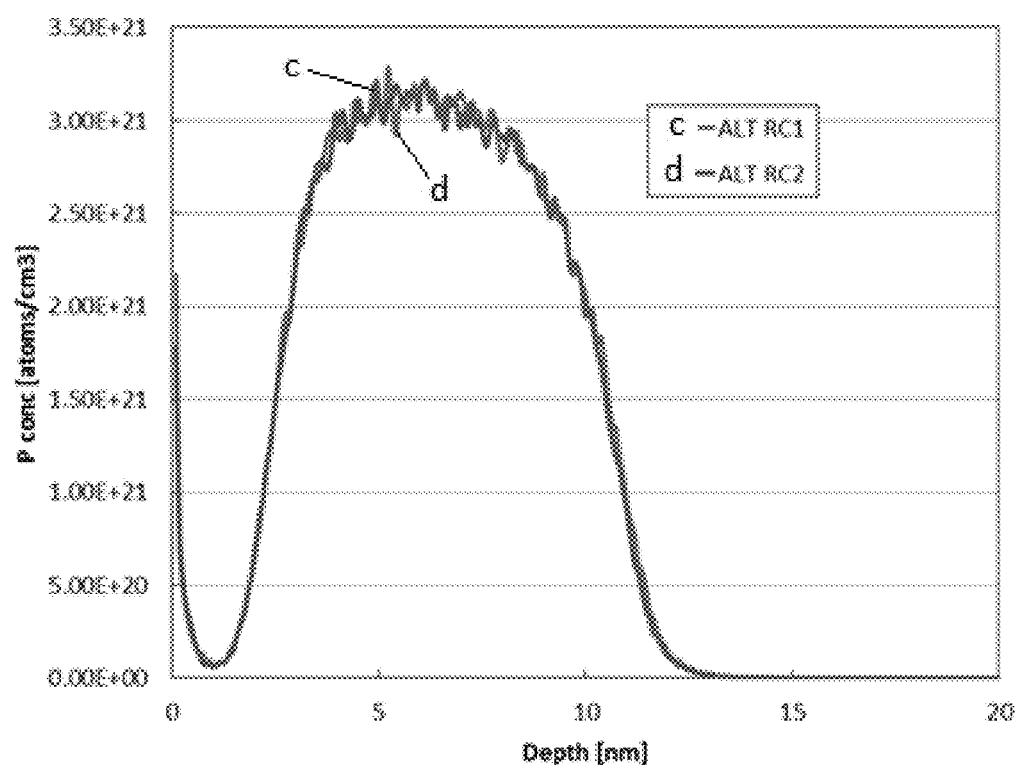
FIG. 18 is a graph showing a phosphorous concentration of a phosphorus silicon glass (PSG) film in a depth direction which was deposited in each reaction chamber of a dual-chamber PEALD apparatus according to an embodiment of the present invention.

FIG. 17 is a graph showing a phosphorous concentration of the phosphorus silicon glass (PSG) film in a depth direction which was deposited in each reaction chamber according to the Comparative Example, STD RC1 and STD RC2 represent the first reaction chamber and the second reaction chamber in the Comparative Example. FIG. 18 is a graph showing a phosphorous concentration of the phosphorus silicon glass (PSG) film in a depth direction which was deposited in each reaction chamber according to Example 1. ALT RC1 and ALT RC2 represent the first reaction chamber and the second reaction chamber in Example 1. As can be seen from these figures, when the cycle was started alternately from the first and second reaction chambers in Example 1, no significant deviation in the concentration of dopant in the film between the first and second reaction chambers was detected (see c and d), whereas when the cycle was started always from the first reaction chamber, significant deviations in the concentration of dopant in the film between the first and second reaction chambers were detected (see a and b).

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method for performing uniform processing in multiple reaction chambers sharing a first gas source and a second gas source, each reaction chamber having a gas inlet line through which a first gas from the first gas source, a second gas from the second gas source, and a purge gas are introduced into the reaction chamber, wherein a same target treatment is conducted on a first substrate in a first reaction chamber and on a second substrate in a second reaction chamber, separately, said target treatment being cyclic processing constituted by predetermined times of cycles, wherein one cycle is considered to be complete when one cycle of the target treatment is conducted on the first substrate and the second substrate one time at the respective reaction chambers wherein the one cycle starts at one of the reaction chambers and then starts at another of the reaction chambers before the one cycle ends at the one of the reaction chambers, said complete cycle comprising:

(i) supplying the first gas to the multiple reaction chambers through the respective gas inlet lines in a first supply order where the first gas is supplied to the first reaction chamber and then to the second reaction chamber or in a second supply order where the first gas is supplied to the second reaction chamber and then to the first reaction chamber; and (ii) supplying the second gas to the multiple reaction chambers through the respective gas inlet lines in a supply order where the second gas is supplied to one of the multiple reaction chambers and to another of the multiple reaction chambers;

wherein the purge gas is supplied to the multiple reaction chambers through the respective gas inlet lines after every supply of the first gas and after every supply of the second gas so as to purge the first gas and the second gas, respectively, from the multiple reaction chambers and the gas inlet lines, wherein steps (i) and (ii) are conducted in a same order in each cycle in each reaction chamber, wherein the complete cycle is continuously repeated until the predetermined times of cycles of the target treatment are performed in the multiple reaction chambers, wherein the supply order of the first gas is changed between the first supply order and the second supply order every time the complete cycle is repeated.

2. The method according to claim 1, wherein the supply order of the second gas is changed per cycle while the supply order of the first gas is unchanged.

3. The method according to claim 1, wherein the supply order of each of the first gas and the second gas is changed per cycle.

4. The method according to claim 1, wherein one cycle is comprised of steps (i) to (iii), and step (ii) is repeated in the cycle wherein the supply order of the second gas is changed when step (ii) is repeated in the cycle, said cycle being repeated in step (iv).

5. The method according to claim 1, further comprising (iiia) applying RF power in the multiple reaction chambers after every step (iii).

6. The method according to claim 5, wherein RF power is applied to the multiple reaction chambers sequentially or simultaneously.

7. The method according to claim 5, wherein the multiple reaction chambers share an RF generator which generates RF power.

8. The method according to claim 5, wherein the target treatment is deposition of a film by plasma-enhanced atomic layer deposition (PEALD).

9. The method according to claim 1, wherein a supply rate of the first gas is two or more times higher than a supply rate of the second gas.

10. The method according to claim 1, wherein the first gas source and the second gas source include bottles storing liquid compounds, respectively, vaporized gases of which are the first gas and the second gas, respectively.

11. The method according to claim 10, wherein a first gas line from the first gas source is ramified and connected to each of the gas inlet lines of the multiple reaction chambers, and a second gas line from the second gas source is ramified and connected to each of the gas inlet lines of the multiple reaction chambers, wherein the first gas and the purge gas are introduced to the multiple reaction chambers through the first gas line, the lines ramified therefrom, and the gas inlet lines of the multiple reaction chambers, while the second gas and the purge gas are introduced to the multiple reaction chambers through the second gas line, the lines ramified therefrom, and the gas inlet lines of the multiple reaction chambers, wherein each ramified line is provided with a valve, and the gas flows defined in steps (i) to (iii) are controlled using each valve.

12. The method according to claim 11, wherein the purge gas continuously flows alone or with the first gas through the first gas line, while the purge gas continuously flows alone or with the second gas through the second gas line.

13. The method according to claim 1, wherein the multiple reaction chambers are two reaction chambers.

14. The method according to claim 1, wherein the multiple reaction chambers share an exhaust system, and the pressure of each reaction chamber is controlled using the exhaust system.

15. The method according to claim 1, wherein the multiple reaction chambers each comprise another gas line, through which an additive gas or inert gas is supplied to the multiple reaction chambers.

* * * * *